(12) United States Patent
Iijima

(10) Patent No.: US 12,209,990 B2
(45) Date of Patent: Jan. 28, 2025

(54) MAGNETIC BODY INSPECTION DEVICE AND MAGNETIC BODY INSPECTION SYSTEM

(71) Applicant: Shimadzu Corporation, Kyoto (JP)

(72) Inventor: Kenji Iijima, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 323 days.

(21) Appl. No.: 17/291,525

(22) PCT Filed: Nov. 6, 2018

(86) PCT No.: PCT/JP2018/041092
§ 371 (c)(1),
(2) Date: May 26, 2021

(87) PCT Pub. No.: WO2020/095354
PCT Pub. Date: May 14, 2020

(65) Prior Publication Data
US 2022/0003712 A1    Jan. 6, 2022

(51) Int. Cl.
*G01N 27/82* (2006.01)
*G01R 33/02* (2006.01)

(52) U.S. Cl.
CPC ............ *G01N 27/82* (2013.01); *G01R 33/02* (2013.01)

(58) Field of Classification Search
CPC ................................ G01N 27/82; G01R 33/02
See application file for complete search history.

(56) References Cited

U.S. PATENT DOCUMENTS

| | | | | |
|---|---|---|---|---|
| 5,365,169 A | * | 11/1994 | Hosohara | G01N 27/902 324/241 |
| 2009/0140729 A1 | * | 6/2009 | Roziere | G01D 5/2086 324/207.17 |
| 2012/0242352 A1 | * | 9/2012 | Gong | H03K 17/9525 324/656 |
| 2015/0002144 A1 | * | 1/2015 | Boecker | G01N 27/9026 324/240 |

(Continued)

FOREIGN PATENT DOCUMENTS

| | | |
|---|---|---|
| JP | S49-033687 | 3/1974 |
| JP | H07-198684 A | 8/1995 |

(Continued)

OTHER PUBLICATIONS

Extended European Search Report dated May 6, 2022 for the corresponding European patent application No. EP 18939516.3.

(Continued)

*Primary Examiner* — Akm Zakaria
(74) *Attorney, Agent, or Firm* — Muir Patent Law, PLLC

(57) ABSTRACT

A magnetic body inspection device (100) is provided with a detection unit (1) including a differential coil (12) and a detection signal acquisition unit (21). The differential coil (12) has at least a first receiving coil (121) formed of a planar coil and a second receiving coil (122) formed of a planar coil, the first receiving coil and the second receiving coil being differentially connected. The first receiving coil (121) and the second receiving coil (122) are arranged so that detection surfaces thereof are opposed to each other with a magnetic body (W) interposed therebetween.

12 Claims, 10 Drawing Sheets

Second Modification of First Embodiment

(56) References Cited

U.S. PATENT DOCUMENTS

| | | | |
|---|---|---|---|
| 2015/0108970 A1 | 4/2015 | Kurokawa et al. | |
| 2015/0277280 A1* | 10/2015 | Aikawa | G03G 15/086 |
| | | | 324/228 |
| 2017/0356935 A1* | 12/2017 | Hurwitz | G01R 19/12 |
| 2019/0360965 A1 | 11/2019 | Iijima | |

FOREIGN PATENT DOCUMENTS

| | | |
|---|---|---|
| JP | 2005-089172 A | 4/2005 |
| JP | 2007-205826 A | 8/2007 |
| JP | 2009-091127 A | 4/2009 |
| WO | 2018/138850 A1 | 8/2018 |

OTHER PUBLICATIONS

Official communication pursuant to Art. 94(3) EPC issued by the European Patent Office on Jan. 4, 2023 in the corresponding European patent application No. 18939516.3.
First Examination Report from the Indian Patent Office dated Mar. 4, 2022, for corresponding Indian Patent Application No. 202117023480.
Wire Rope Tester MF-550 (Tokyo Rope Mfg. Co., Ltd.))(Jan. 1, 2010).
Written Opinion by the International Search Authority for PCT application No. PCT/JP2018/041092, dated Jan. 22, 2019.

* cited by examiner

First Embodiment

First Embodiment

First Embodiment (A) Side view of the detection unit (B) Cross-sectional view taken along the line 900-900

First Embodiment

First Embodiment

First Embodiment

First Embodiment

FIG. 8
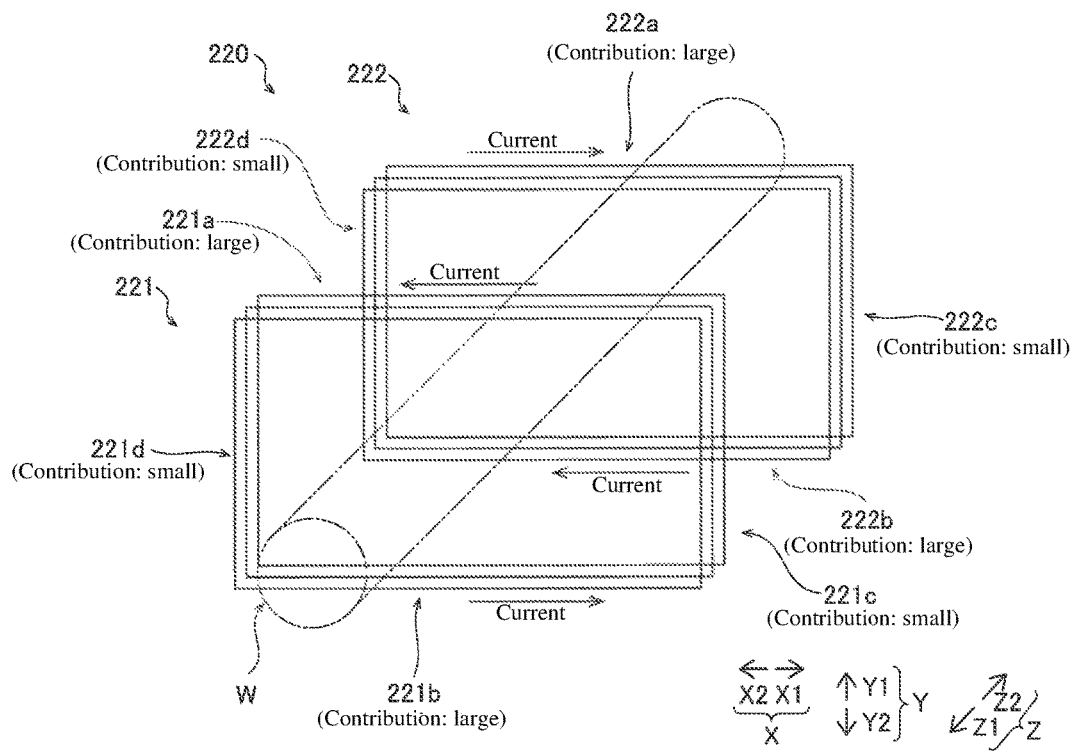
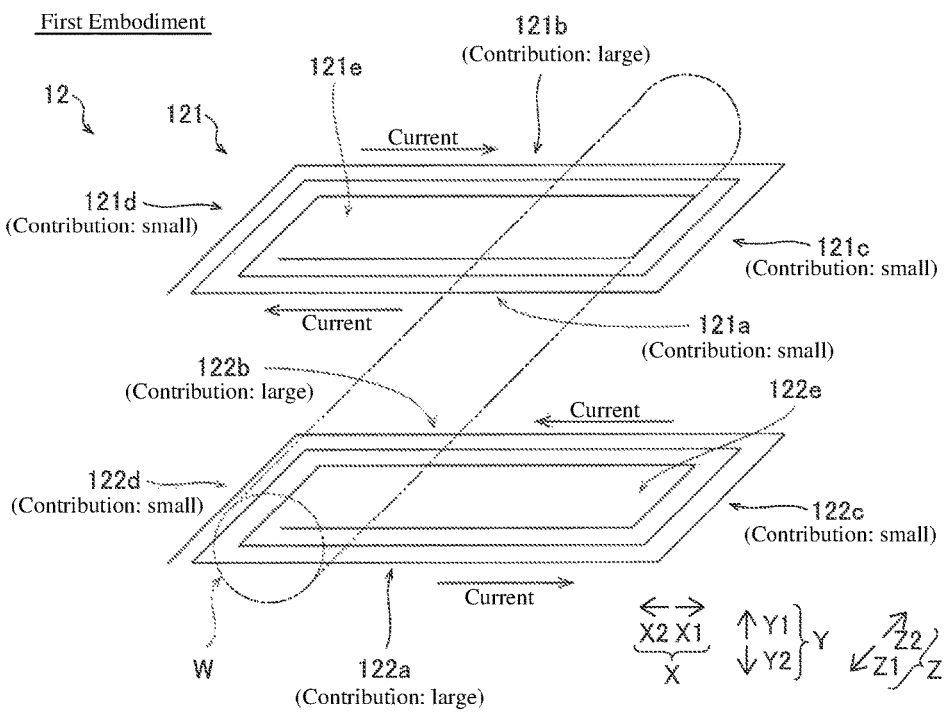
FIG. 9

First Embodiment

First Embodiment (A) State in which the magnetic body arrangement unit is opened (B) State in which the magnetic body arrangement unit is closed

FIG. 12
Second Embodiment
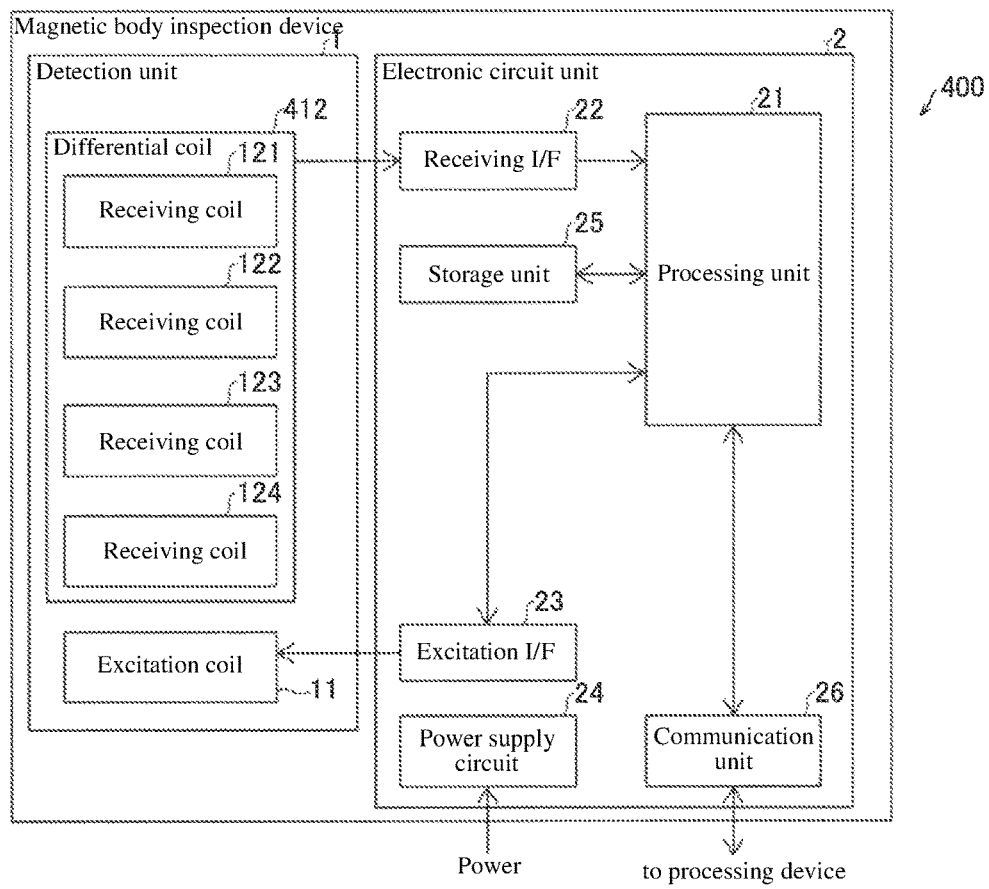
Second Embodiment
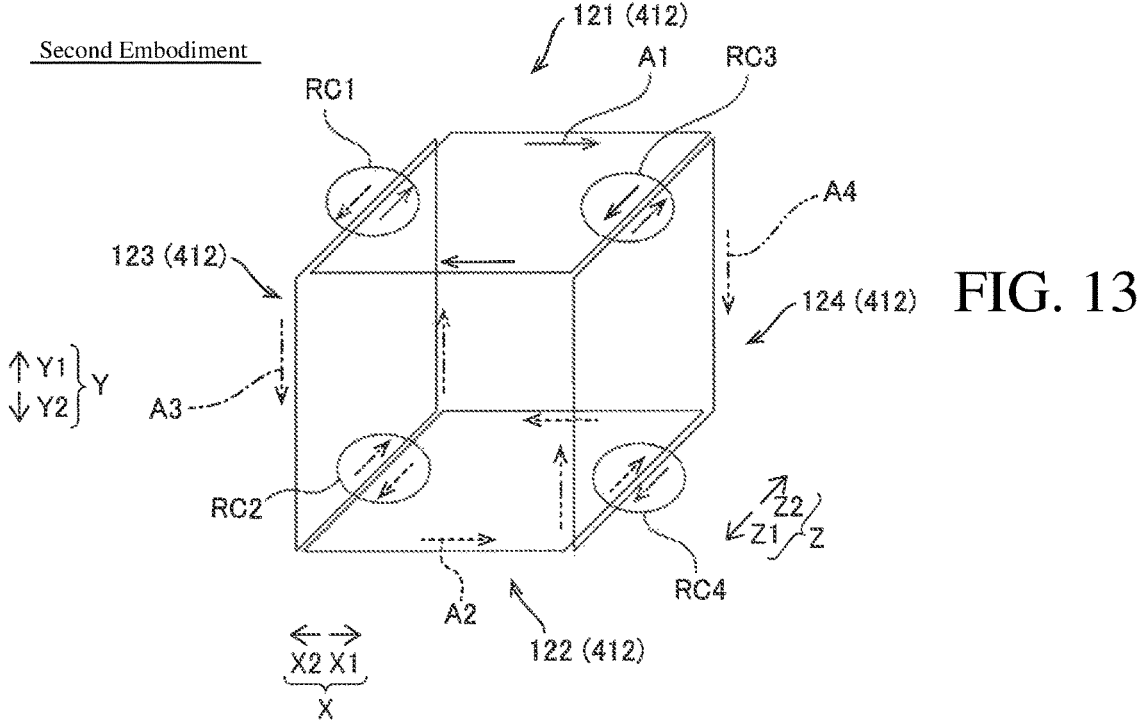
FIG. 13

Second Modification of First Embodiment

Third Modification of First Embodiment

Fourth Modification of First Embodiment

MAGNETIC BODY INSPECTION DEVICE AND MAGNETIC BODY INSPECTION SYSTEM

TECHNICAL FIELD

The present invention relates to a magnetic body inspection device and a magnetic body inspection system.

BACKGROUND ART

Conventionally, a wire rope (magnetic body) used for cranes, elevators, suspension bridges, robotics, etc., is known. In such a wire rope, a visual appearance inspection is carried out to know the degree of degradation due to the wire strand disconnection, abrasion, deformation, etc. In some cases, a non-destructive inspection by magnetic is performed because, for example, the degree of degradation of the inside of a wire rope cannot be known by a visual appearance inspection alone.

As a device for performing such a non-destructive inspection, a magnetic body inspection device capable of inspecting a magnetic body is conventionally known (for example, see Patent Document 1). The above-described Patent Document 1 discloses a rope tester (magnetic body inspection device) capable of inspecting a wire rope (magnetic body). The rope tester determines whether or not damage has occurred in a wire rope based on the detection result of the magnetic flux of the wire rope by a magnetization detector. Each of the magnetization detectors includes a pancake coil for detecting the magnetic flux of the wire rope. The pancake coil around which a conducting wire is wound is provided so as to surround a wire rope by being curved in a U-shape by bending.

PRIOR ART DOCUMENT

Patent Document

Patent Document 1: Japanese Unexamined Patent Application Publication No. 2005-89172

SUMMARY OF THE INVENTION

Problems to be Solved by the Invention

However, in the rope tester described in the above-described Patent Document 1, since the pancake coil in which a conducting wire is wound is provided so as to be curved in a U-shape, the shape and the structure of the coil (pancake coil) is complicated. Further, since bending must be performed to form a pancake coil in which a conducting wire is wound in a U-shape, the manufacturability (production easiness) of the pancake coil deteriorates. As a consequence, there is a problem that it is impossible to determine whether or not damage has occurred in a wire rope while simplifying the configuration and the structure of the coil in which a conducting wire is wound and improving the manufacturability of the oil in which a conducting wire is wound.

The present invention has been made to solve the above-described problems. One object of the present invention is to provide a magnetic body inspection device and a magnetic body inspection system capable of simplifying the shape and the structure of a coil and improving the manufacturability of the coil.

Means for Solving the Problems

In order to attain the above-described object, a magnetic body inspection device according to a first aspect of the present invention is provided with a detection unit including a differential coil for detecting a magnetic flux of a magnetic body, and a detection signal acquisition unit configured to acquire a detection signal of the differential coil, wherein the differential coil includes at least a first receiving coil formed of a planar coil and a second receiving coil formed of a planar coil, the first receiving coil and the second receiving coil being differentially connected, and wherein the first receiving coil and the second receiving coil are arranged so that detection surfaces thereof are opposed to each other with the magnetic body interposed therebetween.

Note that the term "differentially connected" means that a first coil and a second coil are connected such that the direction of the current flowing therethrough differs from each other. For example, in a case where the winding direction of a first coil and the winding direction of a second coil are the same, by connecting the one side terminal of the first coil and the other side terminal of the second coil, the first coil and the second coil are differentially connected. Further, in a case where the winding direction of a first coil and the winding direction of a second coil are different, by connecting one side terminal of the first coil and the other side terminal of the second coil, the first coil and the second coil are differentially connected. That is, in a case where the winding direction of the first coil and the winding direction of the second coil are different, by connecting the terminal of the first coil and the terminal of the second coil alternately, the first coil and the second coil are differentially connected.

In the magnetic body inspection device according to the first aspect of the present invention, by configuring as described above, it is possible to configure such that both the first receiving coil and the second receiving coil of the differential coil each can be configured by a planar coil. Therefore, as compared with the case in which a coil is wound around a magnetic body, it is possible to simplify the shape and the structure of the coil (differential coil). Further, unlike the case in which a coil is provided so as to be curved in a U-shape, there is no need to bend the coil to be curved in a U-shape. Therefore, it is possible to improve the manufacturability of the coil (differential coil). Consequently, it is possible to provide a magnetic body inspection device capable of simplifying the shape and the structure of the coil (differential coil) and improving the manufacturability of the coil (differential coil). Further, by arranging the first receiving coil and the second receiving coil each formed of a planar coil so that the detection surfaces thereof are opposed to each other with the magnetic body interposed therebetween, it is possible to make the differential coil function as a differential coil having a configuration substantially equal to a differential coil wound around the extending direction of the magnetic body. As a result, it is possible to acquire the inspection result substantially equal to a total magnetic flux method in which the inspection of the magnetic body is performed based on the detection signal of the differential coil wound around the extending direction of the magnetic body.

In the magnetic body inspection device according to the above-described first aspect of the present invention, preferably, the differential coil is provided to output a differential signal between one side portion of the first receiving coil and the second receiving coil in a direction in which the magnetic body extends and the other side portion of the first receiving coil and the second receiving coil in the direction in which the magnetic body extends.

With this configuration, one side portion of the first receiving coil and the second receiving coil in the direction in which the magnetic body extends can be regarded as one coil wound around the extending direction of the magnetic body. Also, the other portion of the first receiving coil and the second receiving coil in a direction in which the magnetic body extends can be regarded as one coil wound around the extending direction of the magnetic body. Therefore, even in a case where the first receiving coil and the second receiving coil are each formed of a planar coil, it is possible to easily make the first receiving coil and the second receiving coil function as a differential coil. Consequently, it is possible to easily make the differential coil configured such that the magnetic body is interposed between the first receiving coil and the second receiving coil each formed of a planar coil function as a differential coil wound around the extending direction of the magnetic body while simplifying the configuration of the differential coil by the first receiving coil and the second receiving coil each formed of a planar coil.

In this case, preferably, the first receiving coil and the second receiving coil each are a rectangular coil provided in a flat-plate shaped board, and in the first receiving coil and the second receiving coil, a width in a second direction substantially perpendicular to a first direction in which the magnetic body extends in the detection surface is greater than a width in the first direction.

With this configuration, by forming the first receiving coil and the second receiving coil in a rectangular shape in a flat-plate shaped board, it is possible to place one side portion of the first receiving coil and second receiving coil in a direction in which the magnetic body extends in the same plane perpendicular to the direction in which the magnetic body extends. Further, it is also possible to arrange the other side portion of the first receiving coil and the second receiving coil in a direction in which the magnetic body extends in the same plane perpendicular to the direction in which the magnetic body extends. Consequently, it is possible to make the differential coil function as a differential coil having a configuration approximately equal to a rectangular differential coil wound around the direction in which the magnetic body extends. Further, the magnitude of the magnetic field emitted from the magnetic body attenuates in proportion to the cube of the distance. Therefore, by making the length between the portion of the first receiving coil and the second receiving coil in the direction in which the magnetic body extends and the magnetic body larger than the length between the portion of the first receiving coil and the second receiving coil in the direction substantially perpendicular to the direction in which the magnetic body extends, it is possible to reduce the contribution of the portion of the first receiving coil and the second receiving coil to the detection of damage to the magnetic body in the direction in which the magnetic body extends. Further, it is also possible to increase the contribution of the portion of the first receiving coil and the second receiving to the detection of damage to the magnetic body in a direction substantially perpendicular to the direction in which the magnetic body coil extends. As a consequence, it becomes possible to improve the S/N ratio (signal-to-noise ratio) of the detection signal, and therefore, it is possible to improve the detection accuracy of damage to the magnetic body.

In the configuration in which the width of the first receiving coil and the second receiving coil in a second direction substantially perpendicular to the first direction in which the magnetic body extends in the detection surface is larger than the width in the first direction, preferably, the magnetic body inspection device further includes a magnetic body arrangement unit having an inlet and an outlet through which the magnetic body penetrates, wherein the first receiving coil and the second receiving coil are integrally provided in the magnetic body arrangement unit with the magnetic body interposed therebetween so that detection surfaces of the first receiving coil and the second receiving coil are opposed to each other when the magnetic body is arranged in the magnetic body arrangement unit.

With this configuration, by placing the magnetic body in the magnetic body arrangement unit, in a state in which the first receiving coil and the second receiving coil are not in contact with the magnetic body, it is possible to interpose the magnetic body between the first receiving coil and the second receiving coil. Note that the term "interpose the magnetic body" means that the magnetic body is interposed between the first receiving coil and the second receiving coil in a non-contact manner. In other words, the term "interpose the magnetic body" means that the magnetic body is arranged between the first coil and the second coil in a non-contact state.

In this case, preferably, the first receiving coil and the second receiving coil are integrally provided in the magnetic body arrangement unit such that when the magnetic body is arranged in the magnetic body arrangement unit, a distance from the magnetic body to the detection surface of the first receiving coil and the second receiving coil is smaller than a distance from the magnetic body to both end portions of the first receiving coil or the second receiving coil in the second direction in the detection surface.

With this configuration, when the magnetic body is placed in the magnetic body arrangement unit, it is possible to make the contribution of the portion of the first receiving coil and the second receiving coil extending in a direction in which the magnetic body extends to the detection of damage to the magnetic body smaller than the contribution of the portion of the first receiving coil and the second receiving coil extending in a direction substantially perpendicular to the direction in which the magnetic body extends to the detection of damage to the magnetic body. Consequently, it is possible to reduce the contribution of the portion of the first receiving coil and the second receiving coil where it is not intended to contribute to the detection of damage to the magnetic body to the detection of damage to the magnetic body. It is also possible to increase the contribution of the portion of the first receiving coil and the second receiving coil where it is intended to contribute to the detection of damage to the magnetic body in a direction substantially perpendicular to a direction in which the magnetic body extends.

In the magnetic body inspection device according to the above-described first aspect of the present invention, preferably, the first receiving coil and the second receiving coil are arranged such that the detection surfaces thereof are arranged so as to be substantially in parallel to each other.

With this configuration, in the first receiving coil and the second receiving coil, it is possible to prevent that the distance from one side of the first receiving coil and the second receiving coil to the magnetic body differs the distance from the other side to the magnetic body in the direction in which magnetic body extends. Consequently, it is possible to suppress that the intensity of the detection signal detected at one side portion of the first receiving coil and the second receiving coil in a direction in which the magnetic body extends differs from that directed at the other side. Therefore, it is possible to accurately acquire the detection signal by the differential coil.

In the configuration in which the first receiving coil and the second receiving coil are integrally provided in the magnetic body arrangement unit so that the detection surfaces thereof are opposed to each other with the magnetic body interposed therebetween, preferably, the magnetic body arrangement unit includes a first magnetic body arrangement unit in which the first receiving coil is arranged and a second magnetic body arrangement unit in which the second receiving coil is arranged, and is configured to be switchable between a state in which the magnetic body arrangement unit is opened so that the magnetic body is capable of being arranged in the magnetic body arrangement unit from an outside and a state in which the magnetic body arrangement unit is closed when the magnetic body is inspected, by moving at least one of the first magnetic body arrangement unit and the second magnetic body arrangement unit.

With this configuration, by opening the magnetic body arrangement unit, it is possible to easily place the magnetic body in the magnetic body arrangement unit. Further, by closing the magnetic body arrangement unit, it is possible to prevent the magnetic body from being detached when performing the inspection of the magnetic body.

In the magnetic body inspection device according to the above-described first aspect of the present invention, preferably, the differential coil further includes a third receiving coil and a fourth receiving coil, the third receiving coil and the fourth receiving coil being differentially connected, the third receiving coil and the fourth receiving coil are arranged such that a direction in which detection surfaces of the third receiving coil and the fourth receiving coil are opposed to each other intersects with a direction in which the detection surfaces of the first receiving coil and the second receiving coil are opposed to each other, and the differential coil is differentially connected so that a current flows in a direction to cancel magnetic fields to each other in a portion in a direction along the magnetic body portion.

With this configuration, in the portions along the magnetic body, the magnetic fields are canceled from each other. Therefore, regardless of the distance from the magnetic body to each receiving coil, it is possible to substantially zero the contribution of the portion of each receiving coil to the detection of damage to the magnetic body. Therefore, the one side portion of each receiving coil in the direction in which the magnetic body extends can be regarded as a rectangular coil wound in a plane perpendicular to the direction in which the magnetic body extends. Further, the other portion side of each receiving coil in the direction in which the magnetic body extends can be regarded as a rectangular coil wound in a plane perpendicular to the direction in which the magnetic body extends. As a result, it is possible to make the differential coil function as a differential coil having a configuration closer to that of the rectangular differential coil wound around the direction in which the magnetic body extends. Therefore, it is possible to obtain an inspection result closer to a total magnetic flux method for inspecting a magnetic body based on a detection signal of a differential coil wound around the direction in which the magnetic body extends.

In the magnetic body inspection device according to the above-described first aspect of the present invention, preferably, a plurality of the first receiving coils is provided in a flat plate-shaped first multilayer board having a multilayer structure, and a plurality of second receiving coils is provided in a flat plate-shaped second multilayer board having a multilayer structure, and the differential coil is constituted by differentially connecting the first multilayer board and the second multilayer board.

With this configuration, by increasing the number of the receiving coils provided in the multilayer board, it is possible to increase the number of windings of the differential coil. Consequently, the signal intensity of the detection signal detected by the detection unit can be increased.

In the magnetic body inspection device according to the first aspect of the present invention, preferably, the magnetic body inspection device further includes:

a determination unit configured to perform a state determination of the magnetic body based on the detection signal; and an abnormality determination signal output unit configured to output an abnormality determination signal indicating that an abnormality has occurred in the magnetic body when the determination unit has determined that an abnormality has occurred in the magnetic body.

With this configuration, the determination result of the magnetic body status can be acquired in the magnetic body inspection device. That is, the determination result can be easily acquired without taking out the detection signal from the magnetic body inspection device to the outside. Further, the user can know that an abnormality has occurred in the magnetic body based on the abnormality determination signal at an early stage at a location where the magnetic body is inspected. Therefore, the abnormality that has occurred in the magnetic body can be resolved at an early stage.

In the magnetic body inspection device according to the above-described first aspect of the present invention, preferably, the magnetic body inspection device further includes:

a magnetic field application unit configured to apply a magnetic field in advance to the magnetic body to align a magnitude and an orientation of magnetization of the magnetic body, wherein the differential coil is configured to detect a change in the magnetic field of the magnetic body to which the magnetic field has been applied in advance by the magnetic field application unit.

With this configuration, since a magnetic field is applied to the magnetic body in advance, the direction of the magnetization of the magnetic body can be made substantially constant. Consequently, it is possible to reduce the noise of the detection signal acquired by the detection signal acquisition unit, and therefore it is possible to improve the S/N ratio of the detection signal. Therefore, by improving the S/N ratio of the detection signal, it is possible to more accurately inspect the state (presence or absence of damage, etc.) of the magnetic body.

In the magnetic body inspection device according to the above-described first aspect of the present invention, preferably, the detection unit further includes an excitation coil for exciting a magnetization state of the magnetic body and is configured to detect a magnetic field or a change in the magnetic field in a direction in which the magnetic body extends, the magnetic body being excited in the magnetization state by the magnetic field generated by an excitation current flowing through the excitation coil.

With this configuration, the state of the magnetization of the portion of damage to the magnetic body can be excited by the excitation coil, and therefore, the magnetic field or the change in the magnetic field from the portion of the damage, etc., to the magnetic body can be easily detected. In particular, in the case of applying excitation that changes with time in the magnetization state of the magnetic body by flowing an AC current, etc., through the excitation coil, the magnetic field in the magnetic body also changes. Therefore, without relatively moving the magnetic body and the detection unit, it is possible to change and detect the magnetic field to be detected by the detection unit.

A magnetic body inspection system according to a second aspect of the present invention, includes:

a magnetic body inspection device provided with a detection unit including a differential coil for detecting a magnetic flux of a magnetic body; and a processing device configured to acquire a detection signal of the differential coil, wherein the differential coil has at least a first receiving coil formed of a planar coil and a second receiving coil formed of a planar coil, the first receiving coil and the second receiving coil being differentially connected, wherein the first receiving coil and the second receiving coil are arranged such that detection surfaces thereof are opposed to each other with the magnetic body interposed therebetween, and wherein the processing device is configured to perform a state determination of the magnetic body based on the detection signal and output an abnormality determination signal indicating that an abnormality has occurred in the magnetic body when it is determined that an abnormality has occurred in the magnetic body.

In the magnetic body inspection system according to the second aspect of the present invention, by configuring as described above, in the same manner as in the magnetic body inspection device according to the first aspect, it is possible to provide a magnetic body inspection device capable of simplifying the shape and the structure of the coil and improving the manufacturability of the coil. Further, the user can know that an abnormality has occurred in the magnetic body based on the abnormality determination signal. Therefore, it is easy to determine whether or not an abnormality has occurred in the magnetic body, as compared with the case in which the user determines the state of the magnetic body based on the detection signal. Further, the user can know at an early stage that an abnormality has occurred in the magnetic body based on the abnormality determination signal, so that the abnormality caused in the magnetic body can be solved at an early stage.

Effects of the Invention

According to the present invention, as described above, it is possible to simplify the shape and the structure of a coil and improve the manufacturability of the coil.

BRIEF DESCRIPTION OF THE DRAWINGS

FIG. 8 is a schematic diagram showing a condition in which a differential coil wound around a wire rope detects a magnetic flux of a wire rope according to a Comparative Example.

FIG. 9 is a schematic diagram showing a condition in which a differential coil according to the first embodiment detects the magnetic flux of the wire rope.

FIG. 12 is a block diagram showing the configuration of the magnetic body inspection device according to the first embodiment.

FIG. 13 is a schematic diagram showing a differential coil according to a second embodiment.

EMBODIMENTS FOR CARRYING OUT THE INVENTION

Hereinafter, embodiments in which the present invention is embodied will be described with reference to the attached drawings.

First Embodiment

Referring to FIG. 1 to FIG. 7 and FIG. 9 to FIG. 11, a configuration of a magnetic body inspection system 300 according to a first embodiment will be described.
(Configuration of Magnetic Body Inspection System)

Figure 1:
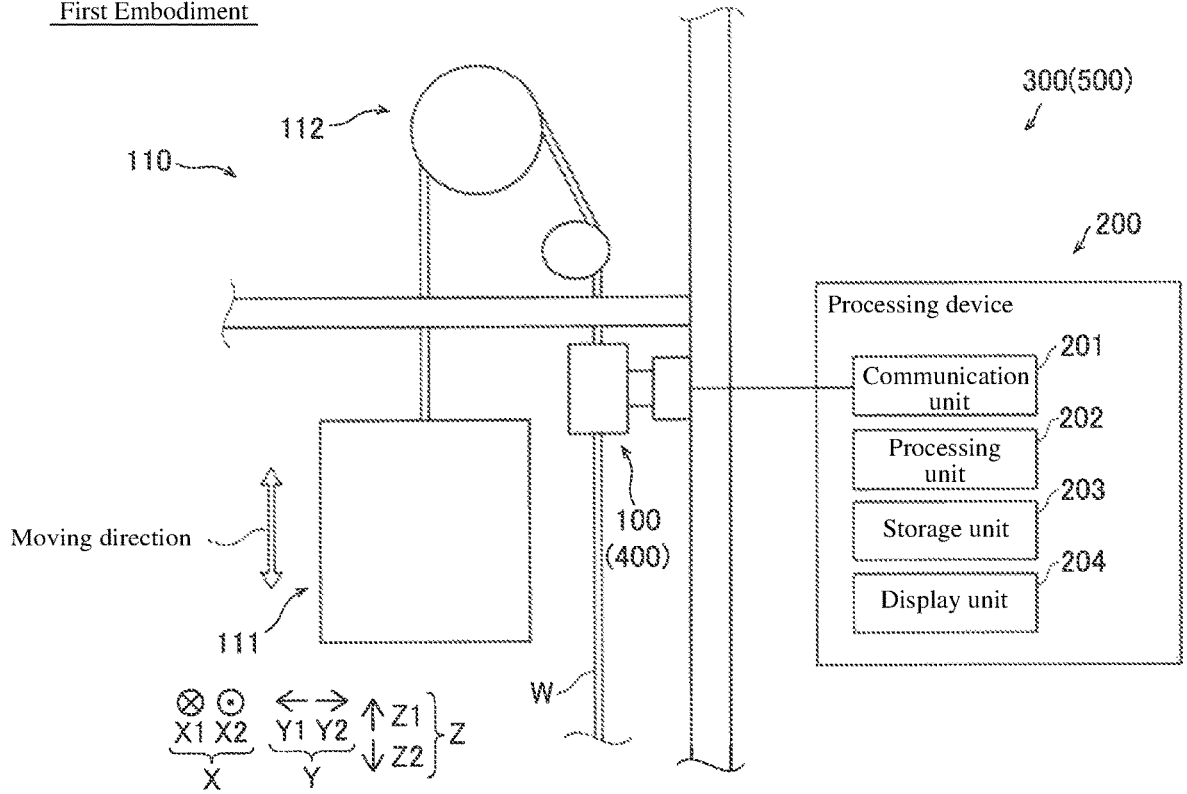
FIG. 1 is a schematic diagram showing a configuration of a magnetic body inspection system according to a first embodiment.

As shown in FIG. 1, the magnetic body inspection system 300 is a system for inspecting damage (disconnection of the wire strand, etc.) of a wire rope W, which is an inspection target and a magnetic body. The magnetic body inspection system 300 is provided with a magnetic body inspection device 100 for measuring a magnetic flux of a wire rope W and a processing device 200 which displays a measurement result of the magnetic flux of the wire rope W by the magnetic body inspection device 100 and an analysis based on the measurement result of the magnetic flux of the wire rope W by the magnetic body inspection device 100. The damage to the wire rope W which is difficult to visually confirm can be confirmed by inspecting the damage to the wire rope W with the magnetic body inspection system 300. Note that the wire rope W is an example of the "magnetic body" recited in claims.

The wire rope W is a magnetic body formed by braiding (e.g., strand-braiding) wire strand materials with magnetic and formed of an elongated member extending in the Z-direction. In order to prevent the wire rope W from being severed due to deterioration, the state (presence or absence of damage or the like) is inspected by the magnetic body inspection device 100. As a result of the measurement of the magnetic flux of the wire rope W, the wire rope W determined that the degree of degradation has exceeded a predetermined criterion is replaced by an operator. Note that in this specification, among two directions perpendicular to each other in a plane substantially perpendicular to a direction (Z-direction) in which the wire rope W extends, one of the directions is referred to as an X-direction. Further, among the two directions perpendicular to each other in a plane substantially perpendicular to the Z-direction, the other direction is referred to as a Y-direction. The Z-direction is an example of the "first direction" recited in claims. The X-direction is an example of the "second direction" recited in claims.

FIG. 1 illustrates an example in which the magnetic body inspection device 100 inspects the wire rope W used to move the cage 111 of the elevator 110. The elevator 110 is provided with the cage 111 and a winding machine 112 for driving the wire rope W. The elevator 110 is configured to move the cage 111 vertically (in the Z-direction) by moving the wire rope W by the winding machine 112. The magnetic body inspection device 100 inspects the wire rope W moved by the winding machine 112 for the damage in a state of being fixed so as not to move relative to the wire rope W.

The wire rope W is arranged to extend in the Z-direction at the position of the magnetic body inspection device 100. The magnetic body inspection device 100 measures the magnetic flux of the wire rope W while moving in the Z-direction (longitudinal direction of the wire rope W) relative to the wire rope W along the surface of the wire rope W. In the first embodiment, the measurement of the magnetic flux of the wire rope W by the magnetic body inspection device 100 is performed while moving the wire rope W used for the elevator 110 in the Z-direction. With this, it is possible to measure the magnetic flux at each position of the wire rope W in the Z-direction. Thus, it is possible to inspect the damage to the wire rope W at each position in the Z-direction.

(Configuration of Processing Device)

As shown in FIG. 1, the processing device 200 is, for example, a personal computer. The processing device 200 is arranged in a space different from the space where the magnetic body inspection device 100 is arranged. The processing device 200 is provided with a communication unit 201, a processing unit 202, a storage unit 203, and a display unit 204. The communication unit 201 is an interface for communication and connects the magnetic body inspection device 100 and the processing device 200 to communicate with each other. The processing device 200 receives a measurement result of the wire rope W (measured data) by the magnetic body inspection device 100 via the communication unit 201. The processing unit 202 controls each part of the processing device 200. The processing unit 202 includes a processor, such as, e.g., a CPU, a memory, and the like. The processing unit 202 analyzes the damage to the wire rope W, such as, e.g., disconnection of wire strands, based on the measurement result of the wire rope W received via the communication unit 201. The storage unit 203 is a storage medium including, for example, a flash memory, and memorizes (stores) the information, such as, e.g., the measurement result of the wire rope W and the analysis result of the measurement result of the wire rope W by the processing unit 202. The display unit 204 is, e.g., a liquid crystal monitor, and displays the information, such as, e.g., the measurement result of the wire rope W and the analysis result of the measurement result of the wire rope W by the processing unit 202.

In the first embodiment, the processing device 200 is configured to perform a state determination of the wire rope W based on the detection signal (measurement result) acquired from the magnetic body inspection device 100 and output an abnormality determination signal indicating that an abnormality has occurred when it is determined that an abnormality has occurred in the wire rope W. For example, the processing device 200 outputs an abnormality determination signal to the display unit 204 to make the display unit 204 display the fact that an error has occurred in the wire rope W. This allows the user to easily confirm that an error has occurred in the wire rope W. Further, for example, the processing device 200 outputs an abnormality determination signal to the device (elevator 110) in which the wire rope W has been inspected to cause the device to perform an operation (stopping operation) corresponding to the abnormality determination signal. The processing device 200 determines whether or not damage has occurred in the wire rope W based on the detection signal. For example, the processing device 200 determines that damage has occurred in the wire rope W when the signal intensity of the detection signal is greater than a predetermined threshold. Further, the processing device 200 determines that damage has occurred in the wire rope W when the degree of coincidence between the shape of the waveform of the detection signal and the shape of the model waveform of the detection signal when damage has occurred in the wire rope W is greater than a predetermined value.

(Configuration of Magnetic Material Inspection Device)

Figure 2:
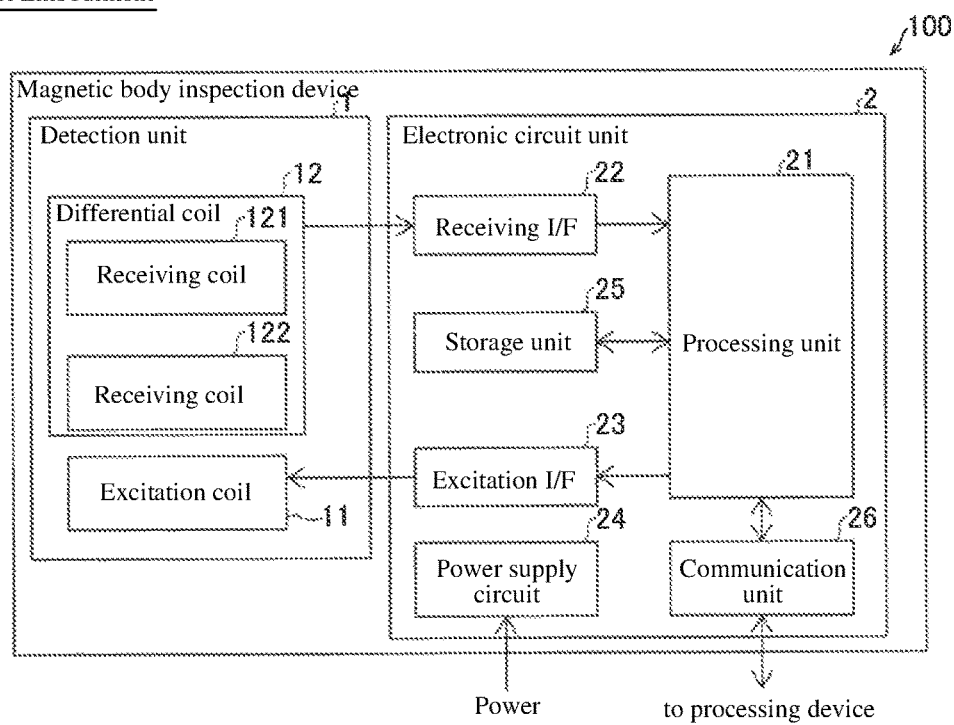
FIG. 2 is a block diagram showing the configuration of the magnetic body inspection device according to the first embodiment.

As shown in FIG. 2, the magnetic body inspection device 100 is provided with a detection unit 1 and an electronic circuit unit 2. The detection unit 1 detects (measures) the magnetic flux of the wire rope W. Specifically, the detection unit 1 includes an excitation coil 11 and a differential coil 12 having a pair of receiving coils 121 and 122. The excitation coil 11 excites the state of the magnetization of the wire rope W. The excitation coil 11 generates the magnetic field along the X-direction (in the longitudinal direction of the wire rope W, the axial direction) to the inside (inside the ring) and applies the generated magnetic field to the wire rope W arranged therein. The differential coil 12 detects (measures) the magnetic field or the change in the magnetic field in the direction (Z-direction) in which the wire rope W extends, the wire rope w being excited in the state of magnetization by the magnetic field generated by the excitation current flowing through the excitation coil 11 in the extending direction of the wire rope W. The differential coil 12 transmits a detection signal (differential signal) corresponding to the magnetic flux of the detected wire rope W. Note that the detailed configuration of the differential coil 12 will be described later. Further, the receiving coils 121 and 122 are examples of the "first receiving coil" and the "second receiving coil" recited in claims, respectively.

The electronic circuit unit 2 includes a processing unit 21, a receiving I/F (interface) 22, an excitation I/F 23, a power supply circuit 24, a storage unit 25, and a communication unit 26. The processing unit 21 is configured to control each part of the magnetic body inspection device 100. The processing unit 21 includes a processor, such as, e.g., a CPU (Central processing device), a memory, an AD converter, and the like. The receiving I/F 22 receives a detection signal (differential signal) of the differential coil 12 and transmits to the processing unit 21. The receiving I/F 22 includes an amplifier. The receiving I/F 22 amplifies the detection signal of the differential coil 12 by an amplifier and transmits to the processing unit 21. The excitation I/F 23 receives the control signal from the processing unit 21. The excitation I/F 23 controls power supplying to the excitation coil 11, based on the received control signal. The power supply circuit 24 receives power from the outside and supplies power to each part of the magnetic body inspection device 100, such as, e.g., the excitation coil 11. The storage unit 25 is a storage medium including, for example, a flash memory, and memorized (stores) the information, such as, e.g., a measurement result (measurement data) of the wire rope W. The communication unit 26 is an interface for communication and connects the magnetic body inspection device 100 and the processing device 200 to be able to communicate with each other. Note that the processing unit 21 is an example of the "detection signal acquisition unit" recited in claims.

(Configuration Related to Differential Coil)

Figure 3:
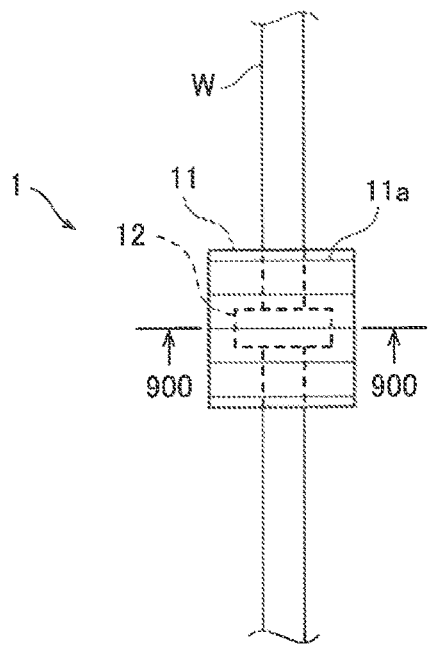
FIG. 3 is a schematic diagram (A) showing a state in which the magnetic body inspection device according to the first embodiment inspects a wire rope as viewed from the Y-direction and a cross-sectional diagram (B) taken along the lines 900-900 in (A) of FIG. 3.
Figure 3:
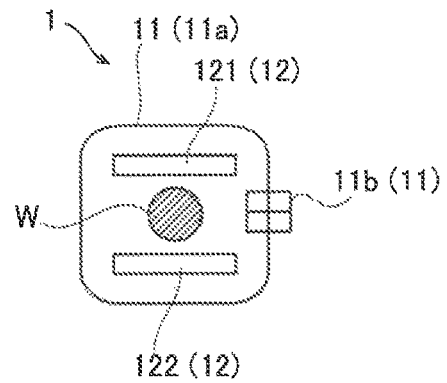
Figure 3:
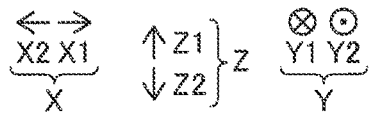
Figure 3:
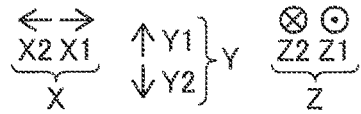

As shown in (A) of FIG. 3 and (B) of FIG. 3, the elevator 110 (see FIG. 1) is provided with a wire rope W. The magnetic body inspection device 100 is configured to be capable of inspecting the wire rope W. Specifically, in the magnetic body inspection device 100, the excitation coil 11 and the differential coil 12 are provided. The excitation coil 11 is constituted by a conducting wire 11a wound to surround the wire rope W. Further, the excitation coil 11 is configured to excite the state of magnetization of the wire rope W. Further, the excitation coil 11 is provided to surround the differential coil 12 together with the wire rope W. The wire rope W and the differential coil 12 are arranged inside (inside the ring) the excitation coil 11. Note that the differential coil 12 may be arranged outside (outside of the ring) the excitation coil 11.

Further, the differential coil 12 detects the magnetic flux of the wire rope W in which the state of the magnetization is excited by the excitation coil 11, and transmits a detection signal. The processing unit 21 acquires the detection signal of the differential coil 12.

Here, as shown in (B) of FIG. 3, in the first embodiment, the differential coil 12 has a receiving coil 122 formed of a planar coil and a receiving coil 121 formed of a planar coil, the receiving coils being differentially connected. The receiving coil 121 and the receiving coil 122 are arranged so that the detection surfaces thereof are opposed to each other with the wire rope W interposed therebetween. The differential coil 12 is configured such that, when detecting the magnetic flux of the wire rope W, the wire rope W is arranged between the receiving coil 121 and the receiving coil 122 in a non-contact manner. That is, the receiving coil 121 and the receiving coil 121 are provided so as not to be in contact with the wire rope W when detecting the magnetic flux of the wire rope W. The differential coil 12 is provided to output the differential signal between the signal acquired by the receiving coil 121 and the signal acquired by the receiving coil 122 as a detection signal. Further, as will be described later, the detection unit 1 is configured to be switchable between an open state in which the wire rope W can be arranged from outside and a closed state in which the wire rope W is inspected. Therefore, the excitation coil 11 is also configured to be switchable between the open state and the closed state. Specifically, the excitation coil 11 is provided with a connector 11b for connecting the conducting wire 11a. The excitation coil 11 can be opened by separating the connector 11b. Further, the excitation coil 11 can be closed by connecting the connector 11b. The excitation coil 11 is configured to function as an excitation coil by connecting the conducting wire 11a via the connector 11b in a closed state.

Figure 4:
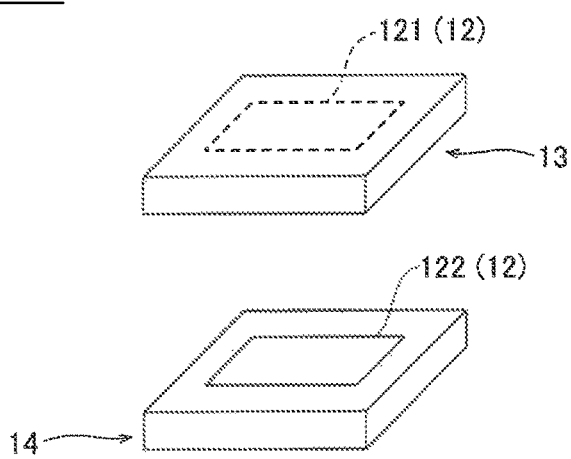
FIG. 4 is a schematic perspective diagram showing a differential coil according to the first embodiment.
Figure 4:
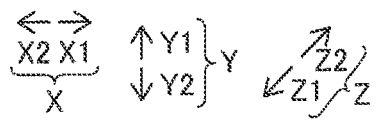

As shown in FIG. 4, the receiving coil 121 is a rectangular coil provided in a flat-plate shaped board 13. Specifically, the receiving coil 121 is formed of a spiral conducting wire wound on the board surface of the flat-plate shaped board 13. Similarly, the receiving coil 122 is a rectangular coil provided on the flat-plate shaped board 14. Specifically, the receiving coil 122 is formed of a spiral conducting wire wound in the board surface of the flat-plate shaped board 14. Further, the receiving coil 121 and the receiving coil 122 are arranged so that the detection surfaces thereof are substantially parallel to each other. Note that the detection surface of each of the receiving coil 121 and the receiving coil 122 denotes a surface on which a coil is wound and a surface substantially parallel to each of the board surfaces (or the board rear surfaces) of the flat-plate shaped board 13 and a flat-plate shaped board 14.

Figure 5:
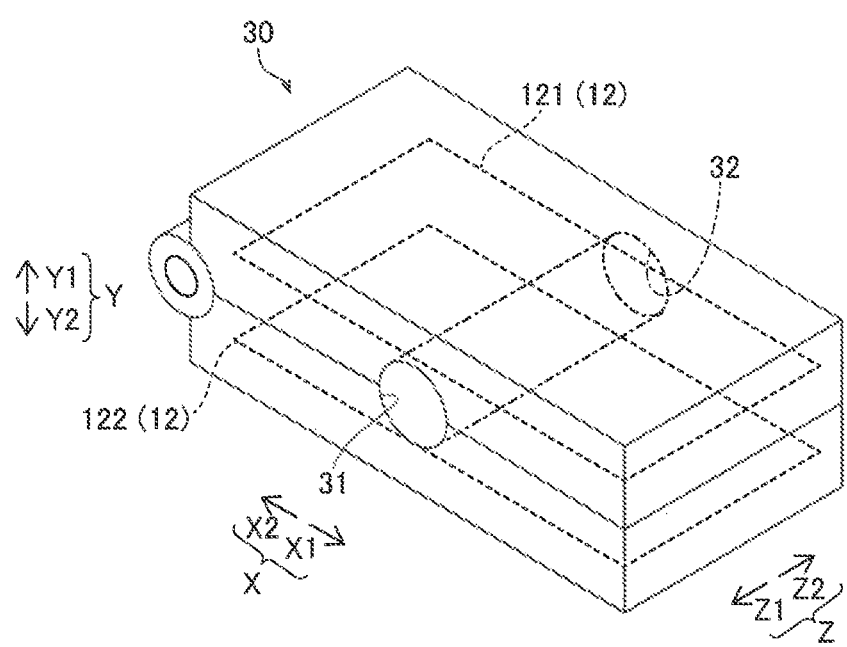
FIG. 5 is a schematic perspective diagram of the magnetic body arrangement unit according to the first embodiment.

As shown in FIG. 5, the magnetic body inspection device 100 is provided with a magnetic body arrangement unit 30 for arranging the wire rope W between the receiving coil 121 and the receiving coil 122 in a non-contact manner. The magnetic body arrangement unit 30 has an inlet 31 and an outlet 32 through which the wire rope W penetrates. In the first embodiment, since the wire rope W is arranged in a direction extending in the Z-direction, the inlet 31 and the outlet 32 are provided on the Z1-direction side and the Z2-direction side, respectively, in the magnetic body arrangement unit 30. The receiving coil 121 and the receiving coil 122 are integrally provided in the magnetic body arrangement unit 30 so that the detection surfaces thereof are opposed to each other to sandwich the wire rope W when the wire rope W is arranged in the magnetic body arrangement unit 30. The detailed configuration of the magnetic body arrangement unit 30 will be described later.

Figure 6:
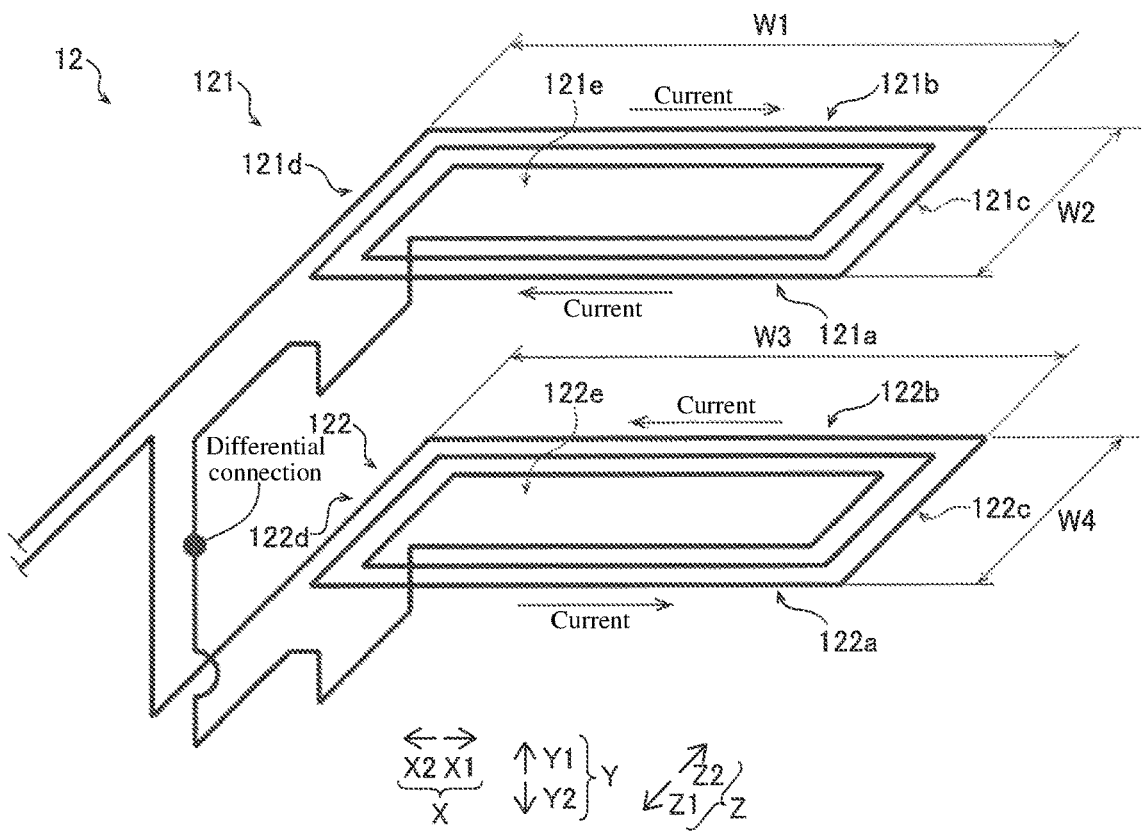
FIG. 6 is a schematic perspective diagram showing a first receiving coil and a second receiving coil of a differential coil according to the first embodiment.

As shown in FIG. 6, the end portion of the receiving coil 121 and the end portion of the receiving coil 122 are differentially connected. Specifically, since the winding direction of the receiving coil 121 and the winding direction of the receiving coil 122 are the same, the receiving coil 121 and the receiving coil 122 are differentially connected by connecting the inner side end portion of the receiving coil 121 and the inner side end portion of the receiving coil 122. The receiving coil 121 and the receiving coil 122 are configured so that a current flows in opposite directions.

The receiving coil 121 is formed in a substantially rectangular shape when viewed from the Y-direction. Specifically, the receiving coil 121 is formed in a substantially rectangular shape in which the longitudinal direction is the X-direction and the lateral direction is the Z-direction. Further, the receiving coil 121 has a width W1 in the X-direction and has a width W2 in the Z-direction. The width W1 is defined as a width, for example, from one side end portion of the receiving coil 121 in the X-direction to the other side end portion thereof. The width W2 is defined as a width, for example, from one side end portion of the receiving coil 121 in the Z-direction to the other side end portion thereof. The width W1 in the X-direction is greater than the width W2 in the Z-direction. The width W1 is, for example, about four times the width W2.

The receiving coil 121 is provided with a longitudinal portion 121a which is a conducting wire portion on one side (Z1-direction side) in the Z-direction, a longitudinal portion 121b which is a conducting wire portion on the other side (Z2-direction side) in the Z-direction, a short portion 121c which is a conducting wire portion on one side (X1-direction side) of X-direction, and a short portion 121d which is a conducting wire portion on the other side (X2-direction side) in the X-direction. The longitudinal portions 121a and 121b are provided so as to extend in the X-direction direction. The short portions 121c and 121d are provided so as to extend in the Z-direction direction. A non-conducting wire portion 121e which is a space surrounded by the longitudinal portions 121a and 121b and the short portions 121c and 121d of the receiving coil 121 is formed.

The receiving coil 122 has a shape corresponding to the receiving coil 121. That is, the receiving coil 122 is formed in a substantially rectangular shape when viewed from the Y-direction. Specifically, the receiving coil 122 is formed in a substantially rectangular shape in which the longitudinal direction is the X-direction and the lateral direction is the Z-direction. Further, the receiving coil 122 has a width W3 in the X-direction and has a width W4 in the Z-direction. The width W3 is defined as a width, for example, from one side end portion of the receiving coil 122 in the X-direction to the other side end portion thereof. The width W4 is defined as, for example, a width from one side end portion of the receiving coil 122 in the Z-direction to the other side end portion thereof. The width W3 in the X-direction is larger than the width W4 in the Z-direction. The width W3 is, for example, about four times the width W4. Note that the width W3 has the same size as the width W1, and the width W4 has the same size as the width W2.

The receiving coil 122 has a longitudinal portion 122a, which is a conducting wire portion on one side (Z1-direction side) in the Z-direction, a longitudinal portion 122b, which is a conducting wire portion on the other side (Z2-direction side) in the Z-direction, a short portion 122c, which is a conducting wire portion on one side (X1-direction side) in the X-direction, and a short portion 122d, which is a conducting wire portion on the other side (X2-direction side) in the X-direction. The longitudinal portions 122a and 122b are each provided to extend in the X-direction direction. The short portions 122c and 122d are each provided to extend in the Z-direction direction. A non-conducting wire part 122e which is a space surrounded by the longitudinal portions 122a and 122b and the short portions 122c and 122d of the receiving coil 122 is formed.

Figure 7:
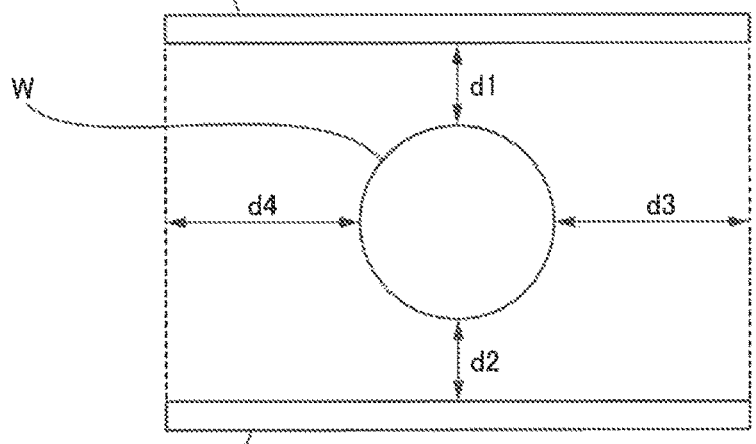
FIG. 7 is a schematic diagram for explaining the positional relation between the first receiving coil/the second receiving coil and the magnetic body according to the first embodiment.

As shown in FIG. 7, the receiving coil 121 and receiving coil 122 are integrally provided in the magnetic body arrangement unit 30 such that, when the wire rope W is arranged in the magnetic body arrangement unit 30, the distances from the wire rope W to the detection surfaces of the receiving coil 121 and the receiving coil 122 are smaller than the distances from the wire rope W to both ends of the detection surface of the receiving coil 121 and the receiving coil 122, respectively, in the X-direction. In the example shown in FIG. 7, the magnetic body arrangement unit 30 is not shown for the sake of convenience.

Specifically, the receiving coil 121 and the receiving coil 122 are arranged such that the distance d1 from the wire rope W to the receiving coil 121 is smaller than the distance d3 in the X-direction from the wire rope W to the X1-direction side end portion of the detection surface of the receiving coil 121. Further, the receiving coil 121 and the receiving coil 122 are arranged such that the distance d1 from the wire rope W to the receiving coil 121 is smaller than the distance d4 in the X-direction from the wire rope W to the X2-direction side end portion of the detection surface of the wire rope W. Further, the receiving coil 121 and the receiving coil 122 are arranged such that the distance d2 from the wire rope W to the receiving coil 122 is smaller than the distance d3 from the wire rope W to the X1-direction side end portion of the detection surface of the receiving coil 121. The receiving coil 121 and the receiving coil 122 are arranged such that the distance d2 from the wire rope W to the receiving coil 122 is smaller than the distance d4 from the wire rope W to the X2-direction side end portion of the detection surface of the receiving coil 122.

The magnitude of the magnetic field emitting from the wire rope W attenuates in proportion to the third power of the distance. Therefore, in order to make the receiving coil 121 and the receiving coil 122 function as a differential coil, it is preferable that the distances d3 and d4 be two or more times the distances d1 and d2, for example. Further, the receiving coil 121 and the receiving coil 122 are provided in the magnetic body arrangement unit 30 so that the distance d1 and the distance d2 are substantially equal. Further, the receiving coil 121 and the receiving coil 122 is provided in the magnetic body arrangement unit 30 so that the distance d3 and the distance d4 are substantially equal.

Here, referring to FIG. 8 and FIG. 9, in the differential coil 12, it will be described that the detection signal equivalent to the differential coil 220 provided to wind around the wire rope W can be acquired.

As shown in FIG. 8, the differential coil 220 according to Comparative Example is provided with a receiving coil 221 and a receiving coil 222 differentially connected to each other and each provided to wind around the wire rope W. The differential coil 220 is provided to output a differential signal between the signal acquired by the receiving coil 221 and the signal acquired by the receiving coil 222 as a detection signal.

Further, the receiving coil 221 (222) is formed in a substantially rectangular shape having a longitudinal direction in the X-direction and a lateral direction in the Y-direction, when viewed from the Z-direction. The receiving coil 221 (222) has a longitudinal portion 221a (222a), which is a conducting wire portion on one side (Y1-direction side) in the Y-direction, a longitudinal portion 221b (222b), which is a conducting wire portion on the other side (Y2-direction side) in the Y-direction, a short portion 221c (222c), which is a conducting wire portion on one side (X1-direction side) in the X-direction, and a short portion 221d (222d), which is a conducting wire portion on the other side (X2-direction side) in the X-direction.

Here, in the differential coil 220, the short portions 221c (222c) and 221d (222d) are provided to be sufficiently farther from the wire rope W than the longitudinal portions 221a (222a) and 221b (222b). Since the resulting signal attenuates in proportion to the third power of the distance from the wire rope W, the signals acquired by the short portions 221c (222c) and 221d (222d) are relatively small, and the signals acquired by longitudinal portions 221a (222a) and 221b (222b) are relatively large.

In other words, the contribution of the short portions 221c (222c) and 221d (222d) to the detection of damage to the wire rope W is small, and the contribution of the longitudinal portions 221a (222a) and 221b (222b) to the detection of damage to the wire rope W is large. As a result, the differential coil 220 substantially outputs the signals acquired by the longitudinal portions 221a and 221b of the receiving coil 221 and the longitudinal portions 222a and 222b of the receiving coil 222 as detection signals. Specifically, the differential coil 220 substantially outputs a differential signal between the signal acquired by the longitudinal portion 221a and 221b of the receiving coil 221 and the signal acquired by the longitudinal portion 222a and 222b of the receiving coil 222, as a detection signal.

As shown in FIG. 9, in the differential coil 12 according to the first embodiment, the short portions 121c (122c) and 121d (122d) are provided to be sufficiently farther from the wire rope W than the longitudinal portions 121a (122a) and 121b (122b). In this case, since the resulting signal attenuates in proportion to the cube of the distance from wire rope W, the signals acquired by the short portions 121c (122c) and 121d (122d) are relatively small, and the signals acquired by the longitudinal portions 121a (122a) and 121b (122b) are relatively large.

In other words, the contribution of the short portions 121c (122c) and 121d (122d) to the detection of damage to the wire rope W is small, and the contribution of the longitudinal portions 121a (122a) and 121b (122b) to the detection of damage to the wire rope W is large. As a result, the differential coil 12 substantially outputs the signals acquired by the longitudinal portions 121a and 121b of the receiving coil 121 and the longitudinal portion 122a and 122b of the receiving coil 122, as a detection signal. Specifically, the differential coil 12 substantially outputs a differential signal between the signals acquired by the longitudinal portion 121a of the receiving coil 121 and the longitudinal portion 122a of the receiving coil 122 and the signals acquired by the longitudinal portion 121b of the receiving coil 121 and the longitudinal portion 122b of the receiving coil 122, as a receiving coil.

As described above, in the differential coil 12 according to the first embodiment and the differential coil 220 according to Comparative Example, since the signal is acquired substantially only by the longitudinal portion, the equivalent detection signal can be acquired.

(Configuration of Magnetic Body Arrangement Unit)

Figure 10:
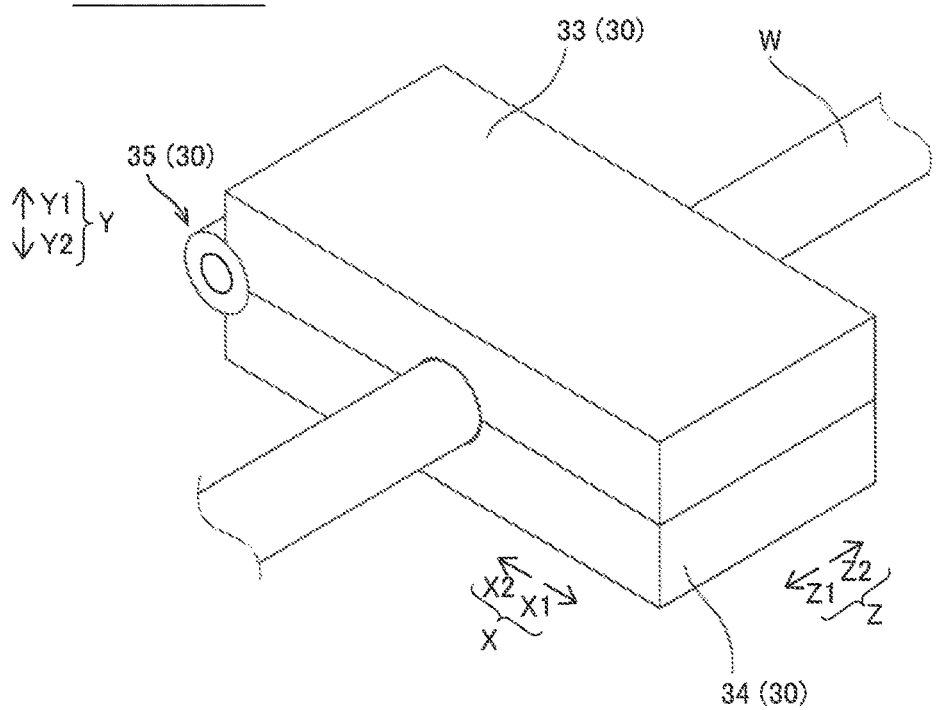
FIG. 10 is a schematic perspective diagram showing a state when a magnetic body is arranged in the magnetic body arrangement portion according to the first embodiment.

As shown in FIG. 10, the magnetic body arrangement unit 30 includes a first magnetic body arrangement unit 33, a second magnetic body arrangement unit 34, and a hinge 35. The first magnetic body arrangement unit 33 and the second magnetic body arrangement unit 34 are connected by the hinge 35. Further, the first magnetic body arrangement unit 33 and the second magnetic body arrangement unit 34 are configured to be rotatable around the hinge 35. The magnetic body arrangement unit 30 is configured such that a state in which the magnetic body arrangement unit 30 is opened so that the wire rope W can be arranged from the outside in the magnetic body arrangement unit 30 and a state in which the magnetic body arrangement unit 30 is closed when the wire rope W is inspected can be switched by moving either the first magnetic body arrangement unit 33 or the second magnetic body arrangement unit 34.

Figure 11:
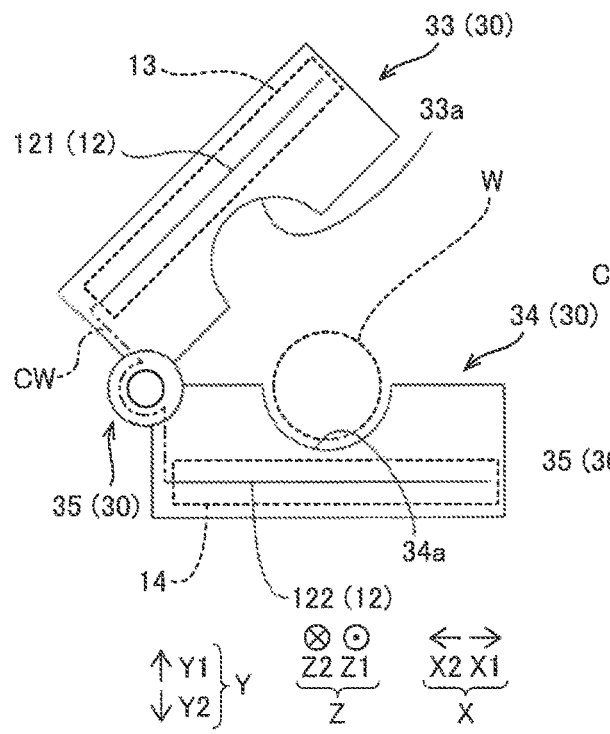
FIG. 11 is a schematic diagram (A) showing a state in which the magnetic body arrangement unit according to the first embodiment is opened and a schematic diagram (B) showing a state in which the magnetic body arrangement unit is closed.
Figure 11:
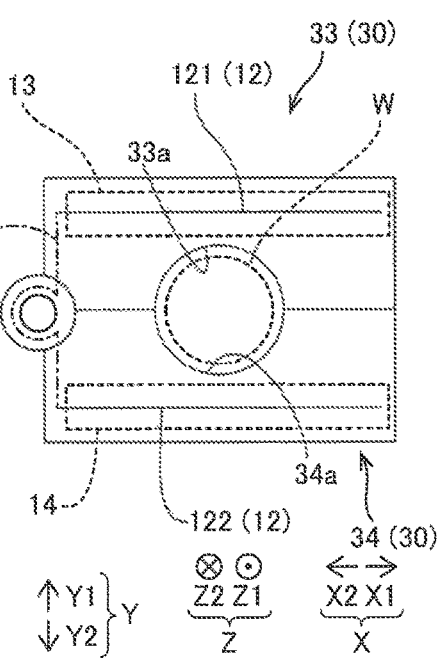

In the first embodiment, the magnetic body arrangement unit 30 is configured to be switchable between a state in which the magnetic body arrangement unit 30 is opened as shown in (A) of FIG. 11 and a state in which the magnetic body arrangement unit 30 is closed as shown in (B) of FIG. 11, by moving the first magnetic body arrangement unit 33. Note that the hinge 35 is configured to penetrate a conducting wire CW therein. Therefore, the receiving coil 121 provided in the first magnetic body arrangement unit 33 and the receiving coil 122 provided in the second magnetic body arrangement unit 34 are differentially connected by being connected by the conducting wire CW.

The first magnetic body arrangement unit 33 is provided with a recess 33a. Further, the second magnetic body arrangement unit 34 is provided with a recess 34a. The recesses 33a and recesses 34a are respectively provided in the first magnetic body arrangement unit 33 and the second magnetic body arrangement unit 34 to extend in the Z-direction. Further, the recess 33a and the recess 34a are provided in the first magnetic body arrangement unit 33 and the second magnetic body arrangement unit 34 so that the positions in the X-direction are substantially equal. Accordingly, as shown in (B) of FIG. 11, the recess 33a and the recess 34a form an inlet 31 and an outlet 32 in a state in which the magnetic body arrangement unit 30 is closed.

In the first embodiment, the wire rope W is introduced into the magnetic body inspection device 100 by making the magnetic body arrangement unit 30 in an open state. Thereafter, the wire rope W is inspected by making the magnetic body arrangement unit 30 in a closed state.

Effects of First Embodiment

In this first embodiment, the following effects can be acquired.

In the first embodiment, as described above, the magnetic body inspection device 100 is provided with a detection unit 1 including the differential coil 12 for detecting the magnetic flux of the wire rope W and the processing unit 21 for acquiring the detection signal of the differential coil 12. The differential coil 12 includes at least the receiving coil 121 formed of a planar coil and a receiving coil 122 formed of a planar coil, the receiving coil 121 and the receiving coil 122 being differentially connected. The receiving coil 121 and the receiving coil 122 are arranged so that the detection surfaces thereof are opposed to each other with the wire rope W interposed therebetween. Thus, it is possible to configure such that both the receiving coil 121 and the receiving coil 122 of the differential coil 12 each can be configured by a planar coil. Therefore, as compared with the case in which a coil is wound around the wire rope W, the shape and the structure of the coil (differential coil 12) can be simplified. Further, unlike the case in which a coil is bent in a U-shape, there is no need to bend a coil in a U-shape. Therefore, it is possible to improve the manufacturability of the coil (differential coil 12). Consequently, it is possible to provide a magnetic body inspection device 100 capable of simplifying the shape and the structure of the coil (differential coil 12) and improving the manufacturability of the coil (differential coil 12). Further, by arranging the receiving coil 121 and the receiving coil 122 each formed of a planar coil so that the detection surfaces thereof are opposed to each other with the wire rope W interposed therebetween, it is possible to make the differential coil 12 function as a differential coil having a configuration substantially equal to a differential coil wound around the Z-direction. Consequently, it is possible to obtain an inspection result substantially equal to that of a total magnetic flux method for inspecting a wire rope W based on a detection signal of a differential coil wound around the Z-direction.

Further, in the first embodiment, as described above, the differential coil 12 is provided to output the differential signal between one side portion (Z1-direction side) of the receiving coil 121 and the receiving coil 122 in the Z-direction and the other side portion (Z2-direction side) of the receiving coil 121 and the receiving coil 122 in the Z-direction. This allows one side (Z1-direction side) portion of the receiving coil 121 and the receiving coil 122 in the Z-direction to be regarded as one coil wound around the Z-direction. Also, the other side (Z2-direction side) portion of the receiving coil 121 and the receiving coil 122 in the Z-direction can be considered as one coil wound around the Z-direction. Therefore, even in a case in which the receiving coil 121 and the receiving coil 122 each are formed of a planar coil, the receiving coil 121 and the receiving coil 122 can easily function as a differential coil 12. Consequently, the differential coil 12 having a configuration in which the wire rope is interposed between the receiving coil 121 and the receiving coil 122 each formed of a planar coil can be easily made to function as a differential coil wound around the Z-direction while simplifying the configuration of the differential coil 12 by the receiving coil 121 and the receiving coil 122 each formed of a planar coil.

Further, in the first embodiment, as described above, the receiving coil 121 and the receiving coil 122 are rectangular coils provided in the flat-plate shaped board 13 and the flat-plate shaped board 14. In the receiving coil 121 and the receiving coil 122, the width W1 and the width W3 in the X-direction substantially perpendicular to the Z-direction in which the wire rope W extends in the detection surface is greater than the width W2 and the width W4 in the Z-direction. Thus, in the flat-plate shaped board 13 and the flat-plate shaped board 14, it is possible to place one side portion of the receiving coil 121 and the receiving coil 122 in the Z-direction in the same plane perpendicular to the Z-direction. It is also possible to place the other side portion of the receiving coil 121 and the receiving coil 122 in the Z-direction in in the same plane perpendicular to the Z-direction. Consequently, it is possible to make the differential coil 12 function as a differential coil having a configuration substantially equal to a rectangular differential coil wound around the Z-direction. Also, by making the length between the Z-direction portion of the receiving coil 121 and the receiving coil 122 (short portions 121c, 121d, 122c, 122d) and the wire rope W larger than the length between the X-direction portion of the receiving coil 121 and the receiving coil 122 (longitudinal portion 121a, 121b, 122a, 122b) and the wire rope W, it is possible to reduce the contribution of the Z-direction portion of the receiving coil 121 and the receiving coil 122 (short portions 121c, 121d, 122c, 122d) to the detection of damage to the wire rope W. It is also possible to increase the contribution of the X-direction portions (longitudinal portions 121a, 121b, 122a, 122b) of the receiving coil 121 and the receiving coil 122 to the detection of damage to the wire rope W. As a consequence, it is possible to improve the S/N ratio (signal-to-noise ratio) of the detection signal. Thus, it is possible to improve the detection accuracy of damage to the wire rope W.

Further, in the first embodiment, as described above, the magnetic body inspection device 100 is further provided with the magnetic body arrangement unit 30 having the inlet 31 and the outlet 32 through which the wire rope W penetrates. The receiving coil 121 and the receiving coil 122 are integrally provided in the magnetic body arrangement unit 30 so that the detection surfaces thereof are opposed to each other with the wire rope W interposed therebetween. With this, by placing the wire rope W in the magnetic body arrangement unit 30, it is possible to sandwich the wire rope W by the receiving coil 121 and the receiving coil 122 in a state in which the receiving coil 121 and the receiving coil 122 are not in contact with the wire rope W.

Further, in the first embodiment, as described above, the receiving coil 121 and the receiving coil 122 are provided integrally with the magnetic body arrangement unit 30 so that the distance d1 and the distance d2 from the wire rope W to the detection surface of the receiving coil 121 and the receiving coil 122 are smaller than the distance d3 and the distance d4 from the wire rope W to the X-direction both end portions of the detection surface of the receiving coil 121 or the receiving coil 122, when the wire rope W is arranged in the magnetic body arrangement unit 30. With this, when the wire rope W is arranged in the magnetic body arrangement unit 30, it is possible to make the contribution of the Z-direction portions (short portions 121c, 121d, 122c, 122d) of the receiving coil 121 and the receiving coil 122 from the wire rope W to the detection of damage to the wire rope W smaller than the contribution of the Z-direction portions (short portion 12w1c, 121d, 122c, 122d) of the receiving coil 121 and the receiving coil 122 from the wire rope W. As a consequence, it is possible to reduce the contribution of the Z-direction parts of the receiving coil 121 and the receiving coil 122, which are not intended to contribute to the detection of damage to the wire rope W, to the detection of damage to the wire rope W, and it is possible to increase the contribution of the X-direction parts (longitudinal portions 121a, 121b, 122a, 122b) of the receiving coil 121 and the receiving coil 122, which are intended to contribute to the detection of damage to the wire rope W, to the detection of damage to the wire rope W.

Further, in the first embodiment, as described above, the receiving coil 121 and the receiving coil 122 are arranged so that the detection surfaces thereof are substantially in parallel to each other. As a result, in the receiving coil 121 and the receiving coil 122, it is possible to suppress that the distances from one side (Z1-direction side) and the other side (Z2-direction side) of the Z-direction portions (short portion 121c, 121d, 122c, and 122d) to the wire rope W differ. Consequently, in the receiving coil 121 and the receiving coil 122, since it is possible to suppress the intensities of the detection signals detected on one side of the Z-direction (Z1-direction side) and the other side (Z2-direction side) from becoming different. Therefore, it is possible to accurately acquire the detection signal by the differential coil 12.

Further, in the first embodiment, as described above, the magnetic body arrangement unit 30 includes the first magnetic body arrangement unit 33 in which the receiving coil 121 is arranged and the second magnetic body arrangement unit 34 in which the receiving coil 122 is arranged. The magnetic body arrangement unit 30 is configured to be switchable between a state in which the magnetic body arrangement unit 30 is opened so that the wire rope W can be arranged from the outside in the magnetic body arrangement unit 30 and a state in which the magnetic body arrangement unit 30 is closed when the wire rope W is inspected, by moving the first magnetic body arrangement unit 33 out of the first magnetic body arrangement unit 33 and the second magnetic body arrangement unit 34. With this, by making a state in which the magnetic body arrangement unit 30 is opened, it is possible to easily place the wire rope W in the magnetic body arrangement unit 30. Further, by making a state in which the magnetic body arrangement unit 30 is closed, when inspecting the wire rope W, it is possible to suppress the wire rope W from being detached.

Further, in the first embodiment, as described above, the magnetic body inspection system 300 includes a magnetic body inspection device provided with the detection unit 1 including the differential coil 12 for detecting the magnetic flux of the wire rope W and the processing device for acquiring the detection signal of the differential coil 12. The differential coil 12 has at least the receiving coil 121 formed of a planar coil and the receiving coil 122 formed of a planar coil, the receiving coil 121 and the receiving coil 122 being differentially connected, and detection surfaces thereof being opposed to each other with the wire rope W interposed therebetween. The processing device 200 is configured to perform a status determination of the wire rope W based on the detection signal and output an abnormality signal indicating that an abnormality has occurred in the wire rope W when it is determined that an abnormality has occurred in the wire rope W. With this, it is possible to provide the magnetic body inspection system 300 capable of simplifying the shape and the structure of the coil (differential coil 12) in the same manner as in the magnetic body inspection device 100 and improving the manufacturability of the coil (differential coil 12). Further, since the user can know the fact that an abnormality has occurred in the wire rope W based on the abnormality determination signal, as compared with the case where the user determines the state of the wire rope W based on the detection signal, it is possible to easily grasp whether or not an abnormality has occurred in the wire rope W. Further, the user can know at an early stage the fact that an abnormality has occurred in the wire rope W based on the abnormality determination signal. Therefore, it is possible to solve the abnormality that has occurred in the wire rope W as soon as possible.

Further, in the first embodiment, as described above, the detection unit 1 further includes the excitation coil 11 for exciting the state of magnetization of the wire rope W. The detection unit is configured to detect the magnetic field or the change in the magnetic field in a direction (Z-direction) that the wire rope W extends, the wire rope W being excited in the state of the magnetization by the magnetic field generated by the excitation current flowing through the excitation coil 11. With this, since the state of the magnetization of the damaged portion, etc., of the wire rope W is excited by the excitation coil 11, it is possible to easily detect the magnetization or the change in the magnetization in a direction (Z-direction) in which the wire rope W extends from the damaged portion, etc., of the wire rope W. In particular, in a case of giving time-varying excitation to the state of magnetization of the wire rope W by flowing an AC current or the like to the excitation coil 11, the magnetic field of the wire rope W also changes with time. Therefore, without relatively moving the wire rope W and the detection unit 1, it is possible to detect the magnetic field detected by the detection unit 1 while changing it.

Second Embodiment

Next, referring to FIG. 1 and FIG. 12 to FIG. 14, a magnetic body inspection device 400 according to a second embodiment will be described. Unlike the above-described first embodiment in which the differential coil 12 is configured by the receiving coil 121 and the receiving coil 122, in the second embodiment, the differential coil 12 is further provided with a receiving coil 123 and a receiving coil 124, in addition to the receiving coil 121 and the receiving coil 122. Note that the same configuration as that of the above-described first embodiment is denoted by the same reference numeral in the figures, and the description thereof will be omitted.

As shown in FIG. 1, the magnetic body inspection system 500 differs from the magnetic body inspection device 300 of the above-described first embodiment in that it is provided with a magnetic body inspection device 400. As shown in FIG. 12, the magnetic body inspection device 400 differs from the magnetic body inspection device 100 of the above-described first embodiment in that it includes a differential coil 412.

In the second embodiment, the differential coil 412 of the magnetic body inspection device 400 further includes differential connected receiving coil 123 and receiving coil 124, in addition to the differential connected receiving coil 121 and receiving coil 122. Note that the receiving coil 123 and the receiving coil 124 are examples of the "third receiving coil" and the "fourth receiving coil" as recited in claims, respectively.

Specifically, as shown in FIG. 13, the receiving coil 123 and the receiving coil 124 are arranged so that the direction (X-direction) in which the detection surfaces of the receiving coil 123 and the receiving coil 124 are opposed to each other intersects with the direction (Y-direction) in which the detection surfaces of the receiving coil 121 and the receiving coil 122 are opposed to each other. The receiving coil 123 is provided in a flat-plate shaped board 15 (see (A) of FIG. 14). Further, the receiving coil 124 is provided in the flat-plate shaped board 16 (see (B) of FIG. 14). Similar to the receiving coil 121 and the receiving coil 122, the receiving coil 123 and the receiving coil 124 are the same in the winding direction of the conducting wire, and their inner ends are connected to each other.

Further, as shown in FIG. 13, in the second embodiment, the differential coil 412 is configured such that the length from the wire rope W to the receiving coil 121 and the receiving coil 122 and the length from the wire rope W to the receiving coil 123 and the receiving coil 124 are substantially equal. That is, the differential coil 412 is configured such that the length in the X-direction and the length in the Z-direction are substantially equal.

Note that in the example shown in FIG. 13, for convenience, the illustrations of the wire rope W, the board 15, and the board 16 are omitted. Further, in the example shown in FIG. 13, the current flowing through the receiving coil 121 is illustrated by the arrow A1 of a solid line. Further, the current flowing through the receiving coil 122 is illustrated by the arrow A2 of a dashed-line. Further, the current flowing through the receiving coil 123 is illustrated by the arrow A3 of a one-dot chain line. Further, the current flowing through the receiving coil 124 is illustrated by the arrow A4 of a two-dot chain line.

In the second embodiment, the differential coil 412 is differentially connected in a direction (Z-direction) along the wire rope W so that a current flows to cancel the magnetic field from each other. Specifically, as shown in FIG. 13, the differential coil 412 is configured such that the current flows in the regions RC1, RC2, RC3, and RC4 in a direction to offset the magnetic fields.

Figure 14:
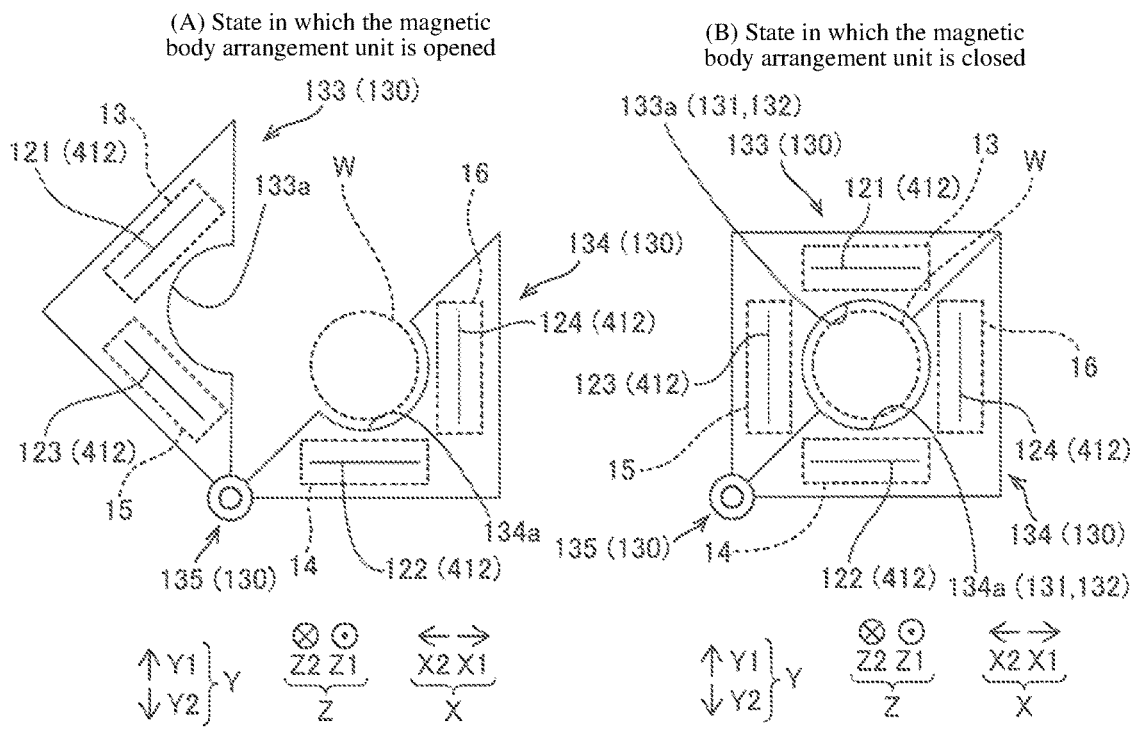
FIG. 14 is a schematic diagram (A) showing a state in which a magnetic body arrangement unit according to a second embodiment is opened and a schematic diagram (B) showing a state in which a magnetic body arrangement unit is closed.

As shown in FIG. 14, in the second embodiment, the magnetic body arrangement unit 130 includes a first magnetic body arrangement unit 133, a second magnetic body arrangement unit 134, and a hinge 135. The first magnetic body arrangement unit 133 and the second magnetic body arrangement unit 134 are configured to be pivotally rotatable about the hinge 135.

The first magnetic body arrangement unit 133 is provided with a receiving coil 121 and a receiving coil 123. The second magnetic body arrangement unit 134 is provided with a receiving coil 122 and a receiving coil 124. In the second embodiment, the magnetic body arrangement unit 130 is configured to be switchable between a state in which the magnetic body arrangement unit 130 is opened as shown in (A) of FIG. 14 and a state in which the magnetic body arrangement unit 130 is closed as shown in (B) of FIG. 14 by moving (rotating) the first magnetic body arrangement unit 133.

In the same manner as in the first embodiment, the first magnetic body arrangement unit 133 in the second embodiment is provided with a concave portion 133a. Further, the second magnetic body arrangement unit 134 is provided with a concave portion 134a. The concave portion 133a and the concave portion 134a are provided in the first magnetic body arrangement unit 133 and the second magnetic body arrangement unit 134, respectively, so as to extend in the Z-direction. The concave portion 133a and the concave portion 134a are provided in the first magnetic body arrangement unit 133 and the second magnetic body arrangement unit 134 so that the positions in the X-direction are substantially equal to each other. Accordingly, the concave portion 133a and the concave portion 134a form the inlet 131 and the outlet 132 when the magnetic body arrangement unit 30 is closed as shown in (B) of FIG. 14.

The rest of the configuration of the second embodiment is the same as that of the first embodiment.

Effects of Second Embodiment

In the second embodiment, the following effects can be acquired.

In the second embodiment, as described above, the differential coil 412 further includes differentially connected receiving coil 123 and receiving coil 124. The receiving coil 123 and the receiving coil 124 are arranged so that the direction (X-direction) in which the detection surfaces of the receiving coil 123 and the receiving coil 124 are opposed to each other intersects with the direction (Y-direction) in which the detection surfaces of the receiving coil 121 and the receiving coil 122 are opposed to each other and provided in the flat-plate shaped board 15 and the flat-plate shaped board 16. The differential coil 412 is differentially connected so that the current flows in a direction to cancel the magnetic fields to each other. With this, in a portion in a direction (Z-direction) along the wire rope W, since the magnetic fields are canceled to each other, regardless of the distance from the wire rope W to the portion of the receiving coil 121 and the receiving coil 122 in a direction (Z-direction) along the wire rope W of (Z-direction), it is possible to substantially eliminate the contribution of the detection of damage to the wire rope W at the portion of the receiving coil 121 and the receiving coil 122 in a direction in which the wire rope W extends. Therefore, the Z-direction one side portion of each receiving coil (receiving coil 121, 122, 123, and 124) can be regarded as a rectangular coil wound in a plane perpendicular to the Z-direction. Also, the Z-direction other side of each receiving coil (receiving coil 121, 122, 123, and 124) can be regarded as a rectangular coil wound in a plane perpendicular to the Z-direction. Consequently, since it is possible to make the differential coil 412 function as a differential coil having a configuration closer to that of the rectangular differential coil wound around the Z-direction, it is possible to obtain the inspection result closer to a total magnetic flux method for inspecting a wire rope W based on a detection signal of a differential coil wound around the Z-direction.

The other effects of the second embodiment are the same as those of the first embodiment.

[Modification]

It should be noted that the embodiment disclosed herein are to be considered in all respects as illustrative and not restrictive. The scope of the present invention is indicated by claims rather than by the embodiments described above, and includes all modifications (modified examples) within the meanings and ranges equivalent to claims.

For example, in the first and second embodiments described above, an example is shown in which the magnetic body to be inspected by the magnetic body inspection device 100 (400) is a wire rope W, but the present invention is not limited thereto. In the present invention, the magnetic body to be inspected by the magnetic body inspection device 100 (400) may be a magnetic body other than a wire rope W.

Further, in the first and second embodiments, an example is shown in which the magnetic body inspection system 300 (500) is a system for inspecting a wire rope W (magnetic body) used in an elevator 110, but the present invention is not limited thereto. In the present invention, the magnetic body inspection system 300 (500) may be a system for inspecting a magnetic body used for cranes, suspension bridges, robots, etc. Note that, in a case where the magnetic body does not move like a wire rope W (magnetic body) used in a suspension bridge, the measurement of the magnetic flux of the magnetic body by the magnetic body inspection device 100 (400) may be performed while moving the magnetic body inspection device 100 (400) along the magnetic body.

Further, in the first and first second embodiments, an example is shown in which the magnetic body inspection device 100 (400) is provided with the excitation coil 11, the present invention is not limited thereto. In the present invention, the magnetic body inspection device 100 (400) is not required to include the excitation coil 11.

Further, in the first and second embodiments described above, an example is shown in which the magnetic body arrangement unit 30 (130) is switched between the open state and the closed state by moving (rotating) the first magnetic body arrangement unit 33 (133), but the present invention is not limited thereto. In the present invention, the magnetic body arrangement unit 30 (130) may be switched between the open state and the closed state by moving the second magnetic body arrangement unit 34 (134).

Further, in the first and second embodiment, an example is shown in which the first magnetic body arrangement unit 33 (233) and the second magnetic body arrangement unit 34 (234) are connected via the hinge 35 (235), but the present invention is not limited thereto. The first magnetic body arrangement unit 33 (233) and the second magnetic body arrangement unit 34 (234) may be connected by members other than the hinge 35 (235). For example, the first magnetic body arrangement unit 33 (233) and the second magnetic body arrangement unit 34 (234) may be openably and closably connected by a flexible board.

Further, in the first and second embodiment described above, an example is shown in which the magnetic body arrangement unit 30 (130) has the hinge 35 (135), and the open state and the closed state of the magnetic body arrangement unit 30 (130) are switched by moving (rotating) the first magnetic body arrangement unit 33 (133), however, the present invention is not limited thereto. For example, as shown in (A) of FIG. 15, the magnetic body arrangement unit 230 may be configured to open the magnetic body arrangement unit 230 by separating the first magnetic body arrangement unit 233 and the second magnetic body 234. Further, as shown in (B) of FIG. 15, it may be configured such that the magnetic body arrangement unit 230 is made in a closed state by coupling the first magnetic body arrangement unit 233 and the second magnetic body 234. When the magnetic body arrangement unit 230 is made in a closed state by coupling the first magnetic body arrangement unit 233 and the second magnetic body 234, the receiving coil 121 and the receiving coil 122 may be configured to connect via a connector 236.

Figure 15:
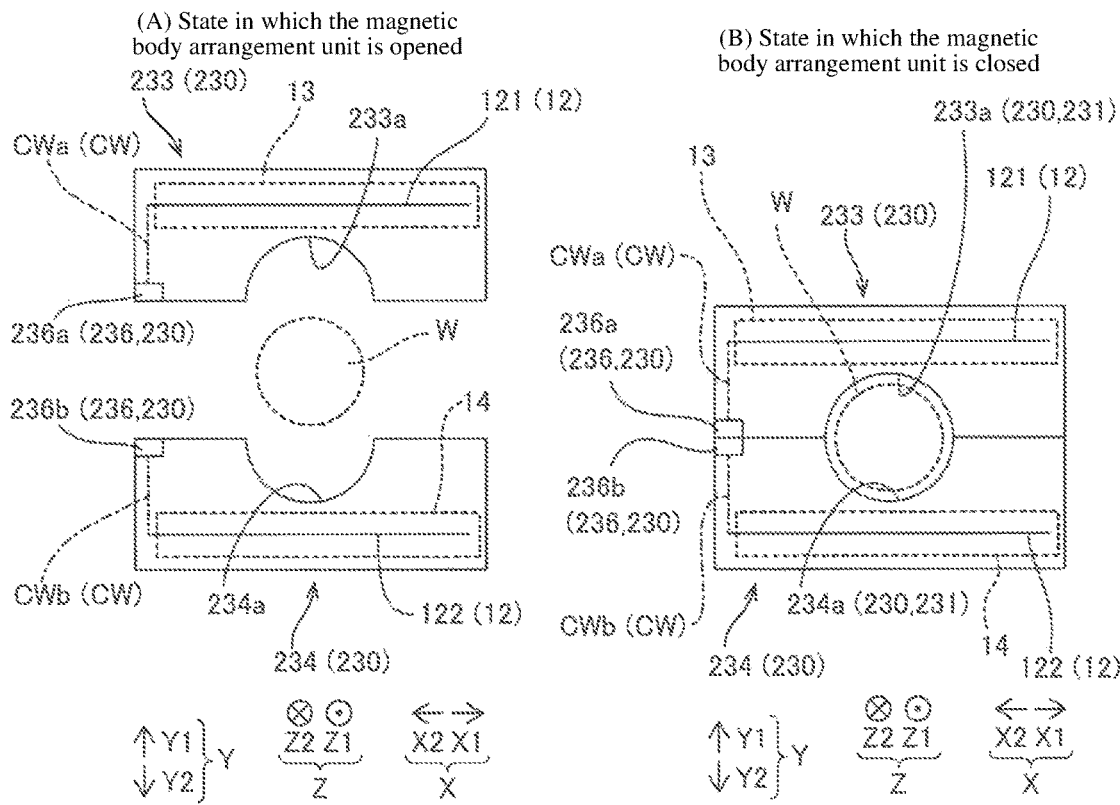
FIG. 15 is a schematic diagram (A) showing a state in which a magnetic body arrangement unit according to a first modification of the first embodiment is opened and a schematic diagram (B) showing a state in which the magnetic body arrangement unit is closed.

Specifically, as shown in (B) of FIG. 15, the first magnetic body arrangement unit 233 is provided with a first connector 236a. The first connector 236 a is connected to the receiving coil 121 by a conducting wire CWa. Further, the second magnetic body arrangement unit 234 is provided with a second connector 236b. The second connector 236b is connected to the receiving coil 122 by a conducting wire CWb. In a state in which the magnetic body arrangement unit 230 is closed, the receiving coil 121 and the receiving coil 121 are connected by the conducting wire CWa and the conducting wire CWb by the coupling of the first connector 236a and the second connector 236b. With this configuration, since the magnetic body arrangement unit 230 is opened by dividing the first magnetic body arrangement unit 233 and the second magnetic body 234 to be apart from each other, it is easier to arrange the wire rope W in the magnetic body arrangement unit 230, as compared with the configuration of the first embodiment or the second embodiment. Note that the first magnetic body arrangement unit 233 and the second magnetic body arrangement unit 234 are provided with a concave portion 233a and a concave portion 234a, respectively, and form an inlet 231 and an outlet 232 in a state in which the magnetic body arrangement unit 230 is closed as shown in (B) of FIG. 15.

Figure 16:
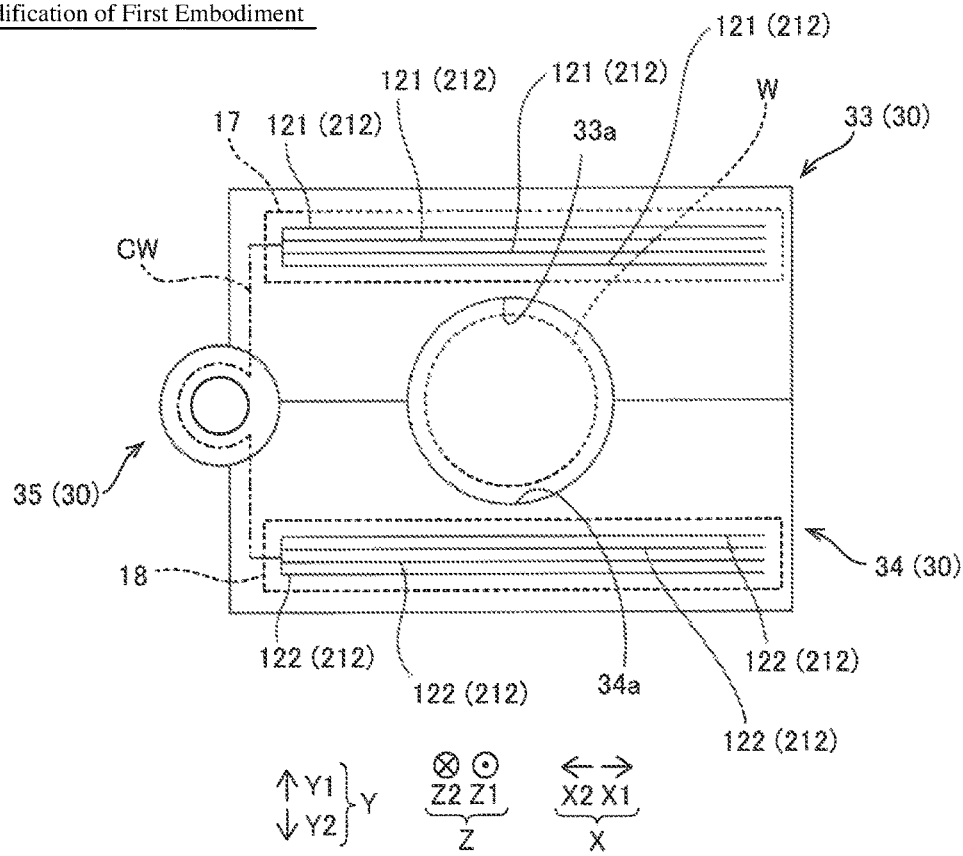
FIG. 16 is a schematic diagram of a differential coil according to a second modification of the first embodiment.

Further, in the first and second embodiments, an example is shown in which the flat-plate shaped board 13 (14, 15, 16) is provided with one receiving coil 121 (122, 123, 124), but the present invention is not limited thereto. For example, as shown in FIG. 16, it may be configured such that a plurality of receiving coils 121 is provided in a flat plate-shaped first multilayer board 17 having a multi-layer structure, a plurality of receiving coils 122 is provided in the flat plate-shaped second multilayer board 18 having a multi-layer structure, and the differential coil 212 is configured by differentially connecting the first multilayer board 17 and the second multilayer board 18. With this configuration, by increasing the number of the receiving coil 121 and the receiving coil 122 provided in the first multilayer board 17 and the second multilayer board 18, it is possible to increase the winding number of the differential coil 212. Consequently, it is possible to increase the signal intensity of the detection signal detected by the detection unit 1. Note that in the example shown in FIG. 16, the first multilayer board 17 and the second multilayer board 18 each have four layers, and an example of a configuration in which each layer is provided with the receiving coil 121 and the receiving coil 122. However, the number of layers of the first multilayer board 17 and the second multilayer board 18 is not limited to four. The first multilayer board 17 and the second multilayer board 18 may be formed of any number of layers. Further, the first multilayer board 17 and the second multilayer board 18 may not be provided with the receiving coil 121 and the receiving coil 122 in each of the layers.

Figure 17:
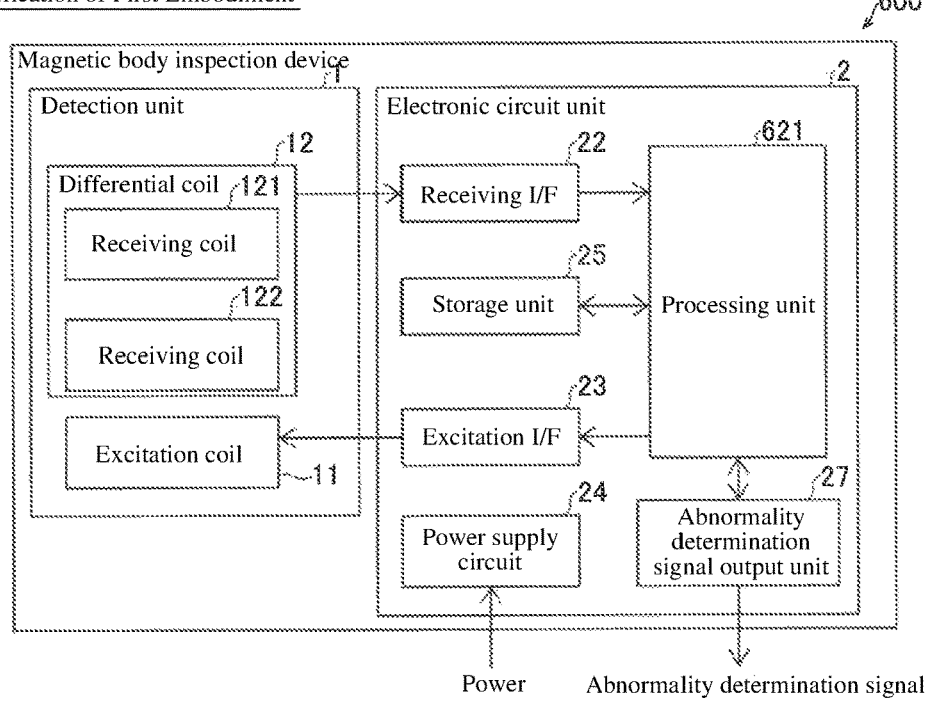
FIG. 17 is a block diagram showing a configuration of a magnetic body inspection device according to a third modification of the first embodiment.

Further, in the first and second embodiments, an example is shown in which the magnetic body inspection device 100 (400) outputs a detection signal to the processing device 200 and the processing device 200 performs the status determination of the wire rope W based on the detection signal acquired from the magnetic body inspection device 100 (400), but the present invention is not limited thereto. For example, as shown in FIG. 17, it may be configured such that the magnetic body inspection device 600 is provided with a processing unit 621 for performing the state determination of the wire rope W based on the detection signal and an abnormality determination signal output unit 27 for outputting an abnormality determination signal indicating that an abnormality has occurred when the processing unit 621 has determined that an abnormality has occurred in the wire rope W. With this configuration, in the magnetic body inspection device 600, it is possible to acquire the determination result of the state of the wire rope W. That is, the determination result can be easily acquired without taking out the detection signal from the magnetic body inspection device 600 to the outside. Further, since the user can know that an abnormality has occurred in the wire rope W at an early stage at a location where the wire rope W is being inspected based on the abnormality determination signal, the abnormality that has occurred in the wire rope W can be resolved at an early stage. Note that the processing unit 621 is an example of the "determination unit" recited in claims.

Further, in the first and second embodiments, an example is shown in which the differential coil 12 (412) is formed in a substantially rectangular shape, but the present invention is not limited thereto. In the present invention, the differential coil 12 (412) is not required to be formed in a substantially rectangular shape. For example, the differential coil 12 (412) may be formed in a substantially elliptical shape.

Figure 18:
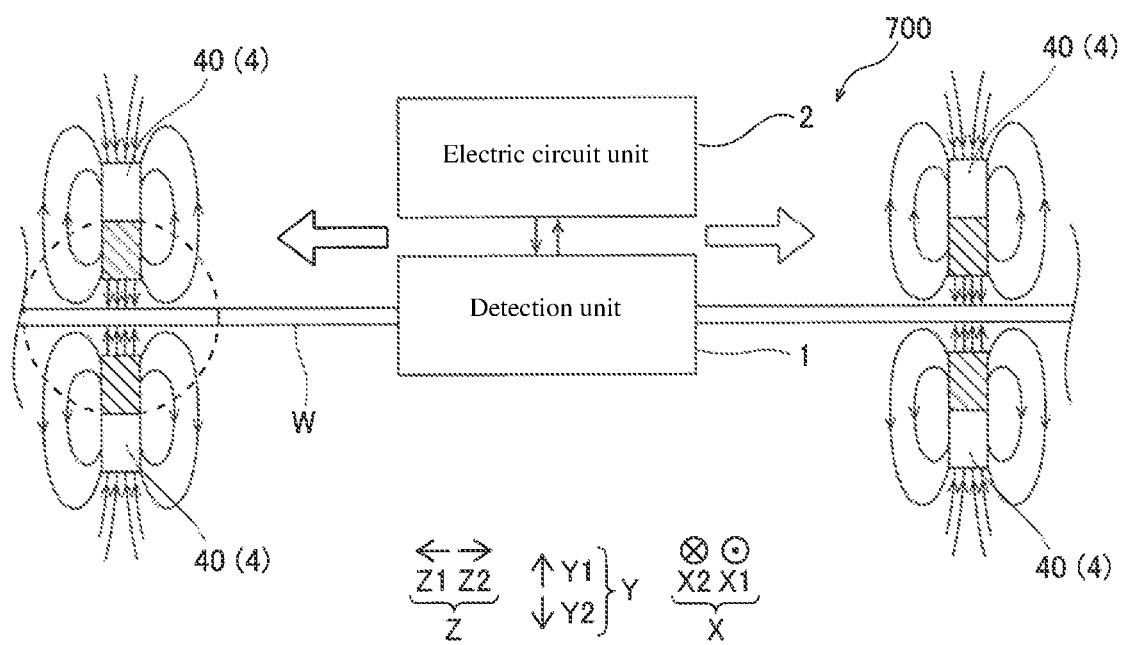
FIG. 18 is a schematic diagram showing a configuration of a magnetic body inspection device according to a fourth modification of the first embodiment.

Further, in the first and second embodiments described above, an example is shown in which the detection unit 1 detects the wire rope W in a state in which the magnitude and the orientation of the magnetization are not aligned, but the present invention is not limited thereto. For example, like the magnetic body inspection device 700 shown in FIG. 18, it may be configured such that it is further provided with a magnetic field application unit 4 for aligning the magnitude and the orientation of the magnetization of the wire rope W by applying a magnetic field to the wire rope W in advance, and the differential coil 12 (412) detects a change in the magnetic field of the wire rope W to which the magnetic field is applied by the magnetic field application unit 4. The magnetic field application unit 4 includes a pair of magnets 40 arranged so as to be spaced apart with the wire rope W interposed therebetween in the Y-direction. According to the configuration as described above, since a magnetic field is applied to the wire rope W in advance, it is possible to make the magnetization direction of the wire rope W substantially constant. Consequently, it is possible to reduce the noise of the detection signal acquired by the detection signal acquisition unit, which in turn can improve the S/N ratio of the detection signal. Therefore, by improving the S/N ratio of the detection signal, it is possible to more accurately inspect the state of the wire rope W (presence or absence of damage, etc.). Note that, in the example shown in FIG. 18, an example is shown in which the magnetic field application unit 4 is provided in each of the Z1-direction side and the Z2-direction side, but the magnetic field application unit 4 may be configured to be provided either one of the Z-directions. Further, in the example shown in FIG. 18, for convenience, the N pole of the magnet 40 is illustrated with the hatching of diagonal lines. Also, the S pole of the magnet 40 is illustrated without hatching diagonal lines.

DESCRIPTION OF THE SYMBOLS

1: Detection unit
4: Magnetic field application unit
11: Excitation coil
12, 412: Differential coil
13, 14, 15, 16: Flat-plate shaped board
17: First multilayer board 18: Second multilayer board
21: Processing unit (detection signal acquisition unit)
27: Abnormality determination signal output unit
30, 130, 230: Magnetic body arrangement unit
31: Inlet
32: Inlet
33, 133, 233: First magnetic body arrangement unit
34, 134, 234: Second magnetic body arrangement unit
100, 400, 600, 700: Magnetic material inspection device
121: Receiving coil (first receiving coil)
122: Receiving coil (second receiving coil)
123: Receiving coil (third receiving coil)
124: Receiving coil (fourth receiving coil)
200: Processing device
300, 500: Magnetic body inspection system
621: Processing unit (determination unit)
W: Wire rope (magnetic body)
W1: Width
W2: Width
W3: Width
W4: Width
X-direction: (Second direction)
Z-direction: (First direction)

The invention claimed is:
1. A magnetic body inspection device comprising:
a detection unit including a differential coil for detecting a magnetic flux of a magnetic body, the magnetic body having an elongated body extending in a first direction; and
a detection signal acquisition unit configured to acquire a detection signal of the differential coil,
wherein the differential coil includes at least a first receiving coil and a second receiving coil, the first receiving coil and the second receiving coil being differentially connected, the first receiving coil and the second receiving coil each have a rectangular shape, and the first receiving coil and the second receiving coil each have first to fourth sides, in which the first and second sides extend in the first direction, and the third and fourth sides extend in a second direction substantially perpendicular to the first direction, and the third and fourth sides are longer than the first and second sides,
wherein the third sides of the first receiving coil and the second receiving coil define a first virtual rectangle including the third sides of the first receiving coil and the second receiving coil, the fourth sides of the first receiving coil and the second receiving coil define a second virtual rectangle including the fourth sides of the first receiving coil and the second receiving coil,
wherein the first receiving coil and the second receiving coil are arranged so that detection surfaces thereof are opposed to each other with the magnetic body interposed therebetween, and
wherein the differential coil is provided to output a signal of a difference between a signal acquired by the first receiving coil and a signal acquired by the second receiving coil as the differential signal, the signal indicates a difference between a first magnetic flux through the first virtual rectangle and a second first magnetic flux through the second virtual rectangle.

2. The magnetic body inspection device as recited in claim 1,
wherein the first receiving coil and the second receiving coil each are provided in a flat-plate shaped board.

3. The magnetic body inspection device as recited in claim 2, further comprising:
a magnetic body arrangement unit having an inlet and an outlet through which the magnetic body penetrates,
wherein the first receiving coil and the second receiving coil are integrally provided in the magnetic body arrangement unit with the magnetic body interposed therebetween so that detection surfaces of the first receiving coil and the second receiving coil are opposed to each other when the magnetic body is arranged in the magnetic body arrangement unit.

4. The magnetic body inspection device as recited in claim 3,
wherein the first receiving coil and the second receiving coil are integrally provided in the magnetic body arrangement unit such that when the magnetic body is arranged in the magnetic body arrangement unit, a distance from the magnetic body to the detection surface of the first receiving coil and the second receiving coil is smaller than a distance from the magnetic body to both end portions of the first receiving coil or the second receiving coil in the second direction in the detection surface.

5. The magnetic body inspection device as recited in claim 1,
wherein the first receiving coil and the second receiving coil are arranged such that the detection surfaces thereof are arranged so as to be substantially in parallel to each other.

6. The magnetic body inspection device as recited in claim 3,
wherein the magnetic body arrangement unit includes a first magnetic body arrangement unit in which the first receiving coil is arranged and a second magnetic body arrangement unit in which the second receiving coil is arranged, and is configured to be switchable between a state in which the magnetic body arrangement unit is opened so that the magnetic body is capable of being arranged in the magnetic body arrangement unit from an outside and a state in which the magnetic body arrangement unit is closed when the magnetic body is inspected, by moving at least one of the first magnetic body arrangement unit and the second magnetic body arrangement unit.

7. The magnetic body inspection device as recited in claim 1,
wherein the differential coil further includes a third receiving coil and a fourth receiving coil, the third receiving coil and the fourth receiving coil being differentially connected,
wherein the third receiving coil and the fourth receiving coil are arranged such that a direction in which detection surfaces of the third receiving coil and the fourth receiving coil are opposed to each other intersects with a direction in which the detection surfaces of the first receiving coil and the second receiving coil are opposed to each other, and the third receiving coil and the fourth receiving coil each are formed in a flat-plate shaped board, and
wherein the differential coil is differentially connected so that a current flows in a direction to cancel magnetic fields to each other in a portion in a direction along the magnetic body.

8. The magnetic body inspection device as recited in claim 1,
wherein a plurality of the first receiving coils is provided in a flat plate-shaped first multilayer board having a multilayer structure, and a plurality of second receiving coils is provided in a flat plate-shaped second multilayer board having a multilayer structure, and wherein the differential coil is constituted by differentially connecting the first multilayer board and the second multilayer board.

9. The magnetic body inspection device as recited in claim 1, further comprising:

a determination unit configured to perform a state determination of the magnetic body based on the detection signal; and an abnormality determination signal output unit configured to output an abnormality determination signal indicating that an abnormality has occurred in the magnetic body when the determination unit has determined that an abnormality has occurred in the magnetic body.

10. The magnetic body inspection device as recited in claim 1, further comprising:

a magnetic field application unit configured to apply a magnetic field in advance to the magnetic body to align a magnitude and an orientation of magnetization of the magnetic body, wherein the differential coil is configured to detect a change in a magnetic field of the magnetic body to which the magnetic field has been applied in advance by the magnetic field application unit.

11. The magnetic body inspection device as recited in claim 1, wherein the detection unit further includes an excitation coil for exciting a magnetization state of the magnetic body and is configured to detect a magnetic field or a change in the magnetic field in a direction in which the magnetic body extends, the magnetic body being excited in the magnetization state by the magnetic field generated by an excitation current flowing through the excitation coil.

12. A magnetic body inspection system comprising:

a magnetic body inspection device provided with a detection unit including a differential coil for detecting a magnetic flux of a magnetic body, the magnetic body having an elongated body extending in a first direction; and a processing device configured to acquire a detection signal of the differential coil, wherein the differential coil has at least a first receiving coil and a second receiving coil, the first receiving coil and the second receiving coil being differentially connected, the first receiving coil and the second receiving coil each have a rectangular shape, and the first receiving coil and the second receiving coil each have first to fourth sides, in which the first and second sides extend in the first direction, and the third and fourth sides extend in a second direction substantially perpendicular to the first direction, and the third and fourth sides are longer than the first and second sides, wherein the third sides of the first receiving coil and the second receiving coil define a first virtual rectangle including the third sides of the first receiving coil and the second receiving coil, the fourth sides of the first receiving coil and the second receiving coil define a second virtual rectangle including the fourth sides of the first receiving coil and the second receiving coil wherein the first receiving coil and the second receiving coil are arranged such that detection surfaces thereof are opposed to each other with the magnetic body interposed therebetween, wherein the differential coil is provided to output a signal of a difference between a signal acquired by the first receiving coil and a signal acquired by the second receiving coil as the differential signal, the signal indicates a difference between a first magnetic flux through the first virtual rectangle and a second first magnetic flux through the second virtual rectangle, and wherein the processing device is configured to perform a state determination of the magnetic body based on the detection signal and output an abnormality determination signal indicating that an abnormality has occurred in the magnetic body when it is determined that an abnormality has occurred in the magnetic body.

\* \* \* \* \*